United States Patent
Kim

(10) Patent No.: US 11,694,627 B2
(45) Date of Patent: *Jul. 4, 2023

(54) SCAN DRIVER AND DISPLAY DEVICE

(71) Applicant: Samsung Display Co., LTD., Yongin-si (KR)

(72) Inventor: Hyun Joon Kim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/569,058

(22) Filed: Jan. 5, 2022

(65) Prior Publication Data

US 2022/0130337 A1 Apr. 28, 2022

Related U.S. Application Data

(63) Continuation of application No. 16/938,408, filed on Jul. 24, 2020, now Pat. No. 11,222,596.

(30) Foreign Application Priority Data

Sep. 4, 2019 (KR) .......................... 10-2019-0109401

(51) Int. Cl.
*G09G 3/3266* (2016.01)
*G09G 3/3275* (2016.01)

(52) U.S. Cl.
CPC ......... *G09G 3/3266* (2013.01); *G09G 3/3275* (2013.01); *G09G 2310/0264* (2013.01);
(Continued)

(58) Field of Classification Search
CPC .. G09G 3/3266; G09G 3/3275; G09G 3/3674; G09G 3/3677; G09G 2310/0264;
(Continued)

(56) References Cited

U.S. PATENT DOCUMENTS 9,443,608 B2 * 9/2016 Matsui .................. G11C 19/28
11,222,596 B2 * 1/2022 Kim ..................... G09G 3/3275
(Continued)

FOREIGN PATENT DOCUMENTS

KR 10-2018-0136012 12/2018

OTHER PUBLICATIONS

Extended European Search Report corresponding to European Patent Application or Patent No. 20190800.1 dated Feb. 8, 2021.

*Primary Examiner* — Tom V Sheng
(74) *Attorney, Agent, or Firm* — Kile Park Reed & Houtteman PLLC

(57) ABSTRACT

A scan driver includes stages, each of the stages receiving first and second clock signals having a first low level as an active level, and a third clock signal having a high level as the active level. Each of the stages includes a logic circuit that changes a voltage of a first node to the first low level based on an input signal and the first clock signal, and changes a voltage of the first node to a second low level lower than the first low level based on the second clock signal, a first output buffer that outputs, as an active-low scan signal, the second clock signal in response to the voltage of the first node, and a second output buffer that outputs, as an active-high scan signal, the third clock signal in response to the voltage of the first node.

20 Claims, 19 Drawing Sheets

(52) U.S. Cl.
CPC .............. *G09G 2310/0286* (2013.01); *G09G 2310/0291* (2013.01); *G09G 2310/08* (2013.01)

(58) Field of Classification Search
CPC ... G09G 2310/0286; G09G 2310/0291; G09G 2310/08
USPC .................................................. 345/55, 100
See application file for complete search history.

(56) References Cited

U.S. PATENT DOCUMENTS

| | | |
|---|---|---|
| 2010/0039423 A1 | 2/2010 | Jeong et al. |
| 2012/0188290 A1 | 7/2012 | Park et al. |
| 2015/0263722 A1 | 9/2015 | Kim et al. |
| 2015/0356909 A1 | 12/2015 | Lim et al. |
| 2016/0172054 A1 | 6/2016 | Shao et al. |
| 2016/0314850 A1 | 10/2016 | Gu et al. |
| 2017/0193885 A1 | 7/2017 | Feng et al. |
| 2018/0012550 A1 | 1/2018 | Lim et al. |
| 2019/0035322 A1 | 1/2019 | Kim et al. |
| 2019/0096348 A1 | 3/2019 | Xu |
| 2019/0347997 A1 | 11/2019 | Park et al. |
| 2020/0184898 A1 | 6/2020 | Choi et al. |
| 2020/0380911 A1 | 12/2020 | Park et al. |
| 2020/0410943 A1 | 12/2020 | Kim |
| 2021/0056910 A1 | 2/2021 | Chung et al. |
| 2021/0082328 A1 | 3/2021 | Feng et al. |

\* cited by examiner

SCAN DRIVER AND DISPLAY DEVICE

CROSS-REFERENCE TO RELATED APPLICATION(S)

This is a continuation application of U.S. patent application Ser. No. 16/938,408, filed Jul. 24, 2020 (now U.S. patent Ser. No. 11,222,596), the disclosure of which is incorporated herein by reference in its entirety. U.S. patent application Ser. No. 16/938,408 claims priority to and benefit of Korean Patent Application No. 10-2019-0109401 under 35 U.S.C. § 119, filed on Sep. 4, 2019 in the Korean Intellectual Property Office, the entire contents of which are incorporated herein by reference.

BACKGROUND

1. Technical Field

Embodiments relate to a scan driver that may output an active-low scan signal and an active-high scan signal, and a display device including the scan driver.

2. Description of the Related Art

Reduction of power consumption may be desirable in a display device employed in a portable device, such as a smartphone, a tablet computer, or the like. Recently, in order to reduce the power consumption of the display device, a low frequency driving technique has been developed. The low frequency driving technique drives or refreshes a display panel at a frequency lower than an input frame frequency of input image data.

However, in a display device to which the low frequency driving technique may be applied, each pixel may include different types of transistors. For example, each pixel of the display device may include not only a low-temperature polycrystalline silicon (LTPS) PMOS transistor, but also an oxide NMOS transistor. A scan driver of the display device should include not only a P-type stage that may generate an active-low scan signal for the PMOS transistor, but also an N-type stage that may generate an active-high scan signal for the NMOS transistor. Accordingly, to generate the scan signals for the different types of transistors, a size and power consumption of the scan driver may be increased.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments may provide a scan driver capable of having a reduced size and reducing power consumption.

Embodiments may provide a display device including the scan driver.

According to an embodiment, there may be provided a scan driver including a plurality of stages receiving first and second clock signals having a first low level as an active level, and a third clock signal having a high level as the active level. Each of the plurality of stages may include a logic circuit that changes a voltage of a first node to the first low level based on an input signal and the first clock signal, and changes the voltage of the first node to a second low level based on the second clock signal. A voltage level of the second low level may be lower than a voltage level of the first low level. Each of the plurality of stages may include a first output buffer that outputs, as an active-low scan signal, the second clock signal in response to the voltage of the first node, and a second output buffer that outputs, as an active-high scan signal, the third clock signal in response to the voltage of the first node.

In an embodiment, an active period of the third clock signal from a rising edge of the third clock signal to a falling edge of the third clock signal may overlap an active period of the second clock signal from a falling edge of the second clock signal to a rising edge of the second clock signal.

In an embodiment, the active period of the third clock signal may partially overlap an active period of the second clock signal.

In an embodiment, a rising edge of the third clock signal may lag a falling edge of the first clock signal. A falling edge of the third clock signal may lag a falling edge of the second clock signal, and may lead a rising edge of the second clock signal.

In an embodiment, the logic circuit may include an input part that transfers the input signal to a third node in response to the first clock signal, a stress relaxing part disposed between the first node and the third node, the stress relaxing part transferring the input signal from the third node to the first node such that the voltage of the first node may be changed to the first low level, a bootstrap part that changes the voltage of the first node to the second low level by bootstrapping the first node in response to the second clock signal, a holding part that holds a second node and a fourth node as the high level while the active-low scan signal and the active-high scan signal may be output, and a stabilizer part that applies a high gate voltage to the third node in response to a voltage of the fourth node, and that changes a voltage of the second node to the second low level after the active-low scan signal and the active-high scan signal are output.

In an embodiment, the input part may include a first transistor including a gate receiving the first clock signal, a first terminal receiving the input signal, and a second terminal electrically connected to the third node.

In an embodiment, the bootstrap part may include a first capacitor including a first electrode electrically connected to a first output node at which the active-low scan signal may be output, and a second electrode electrically connected to the first node.

In an embodiment, the stabilizer part may include a second transistor including a gate electrically connected to the fourth node, a first terminal receiving the high gate voltage, and a second terminal electrically connected to the third node, a second capacitor including a first electrode electrically connected to the fourth node, and a second electrode electrically connected to the second node, a third transistor including a gate electrically connected to the second node, a first terminal electrically connected to the fourth node, and a second terminal receiving the second clock signal, and a fifth transistor including a gate receiving the first clock signal, a first terminal electrically connected to the second node, and a second terminal receiving a low gate voltage.

In an embodiment, each of the plurality of stages may receive a fourth clock signal having the high level as the active level and having a phase different from a phase of the third clock signal. The stabilizer part may include a second transistor including a gate electrically connected to the fourth node, a first terminal receiving the high gate voltage, and a second terminal electrically connected to the third node, a second capacitor including a first electrode electrically connected to the fourth node, and a second electrode electrically connected to the second node, a third transistor including a gate electrically connected to the second node, a first terminal electrically connected to the fourth node, and a second terminal receiving the fourth clock signal, and a fifth transistor including a gate receiving the first clock signal, a first terminal electrically connected to the second node, and a second terminal receiving a low gate voltage.

In an embodiment, the holding part may include a fourth transistor including a gate electrically connected to the third node, a first terminal electrically connected to the second node, and a second terminal receiving the first clock signal, and a sixth transistor including a gate electrically connected to the third node, a first terminal receiving the high gate voltage, and a second terminal electrically connected to the fourth node.

In an embodiment, the stress relaxing part may include a seventh transistor including a gate receiving a low gate voltage, a first terminal electrically connected to the third node, and a second terminal electrically connected to the first node.

In an embodiment, the first output buffer may include an eighth transistor including a gate electrically connected to the first node, a first terminal electrically connected to a first output node at which the active-low scan signal may be output, and a second terminal receiving the second clock signal, and a ninth transistor including a gate electrically connected to a second node, a first terminal receiving a high gate voltage, and a second terminal electrically connected to the first output node.

In an embodiment, the second output buffer may include a tenth transistor including a gate electrically connected to the first node, a first terminal electrically connected to a second output node at which the active-high scan signal may be output, and a second terminal receiving the third clock signal, and an eleventh transistor including a gate electrically connected to a second node, a first terminal receiving a low gate voltage, and a second terminal electrically connected to the second output node.

According to an embodiment, there may be provided a scan driver including a plurality of stages. Each of the plurality of stages may include a first transistor including a gate receiving a first clock signal, a first terminal receiving an input signal, and a second terminal electrically connected to a third node, a second transistor including a gate electrically connected to a fourth node, a first terminal receiving a high gate voltage, and a second terminal electrically connected to the third node, a third transistor including a gate electrically connected to a second node, a first terminal electrically connected to the fourth node, and a second terminal, a fourth transistor including a gate electrically connected to the third node, a first terminal electrically connected to the second node, and a second terminal receiving the first clock signal, a fifth transistor including a gate receiving the first clock signal, a first terminal electrically connected to the second node, and a second terminal receiving a low gate voltage, a sixth transistor including a gate electrically connected to the third node, a first terminal receiving the high gate voltage, and a second terminal electrically connected to the fourth node, a seventh transistor including a gate receiving the low gate voltage, a first terminal electrically connected to the third node, and a second terminal electrically connected to a first node, a first capacitor including a first electrode electrically connected to a first output node, and a second electrode electrically connected to the first node, a second capacitor including a first electrode electrically connected to the fourth node, and a second electrode electrically connected to the second node, an eighth transistor including a gate electrically connected to the first node, a first terminal electrically connected to the first output node, and a second terminal receiving a second clock signal, a ninth transistor including a gate electrically connected to the second node, a first terminal receiving the high gate voltage, and a second terminal electrically connected to the first output node, a tenth transistor including a gate electrically connected to the first node, a first terminal electrically connected to a second output node, and a second terminal receiving a third clock signal, and an eleventh transistor including a gate electrically connected to the second node, a first terminal receiving the low gate voltage, and a second terminal electrically connected to the second output node.

In an embodiment, the first and second clock signals may have a low level as an active level and may have different phases the third clock signal may have a high level as the active level.

In an embodiment, an active period of the third clock signal from a rising edge of the third clock signal to a falling edge of the third clock signal may overlap an active period of the second clock signal from a falling edge of the second clock signal to a rising edge of the second clock signal.

In an embodiment, the active period of the third clock signal may partially overlap the active period of the second clock signal.

In an embodiment, a rising edge of the third clock signal may lag a falling edge of the first clock signal. A falling edge of the third clock signal may lag a falling edge of the second clock signal, and may lead a rising edge of the second clock signal.

In an embodiment, the second terminal of the third transistor may receive the second clock signal, or may receive a fourth clock signal having a high level as an active level and having a phase different from that of the third clock signal.

According to an embodiment, there may be provided a display device that may include a display panel including a plurality of pixels, a data driver that provides data signals to the plurality of pixels, a scan driver that provides active-low scan signals and active-high scan signals to the plurality of pixels, and a controller that controls the data driver and the scan driver. The scan driver may include a plurality of stages receiving first and second clock signals having a first low level as an active level, and a third clock signal having a high level as the active level. Each of the plurality of stages may include a logic circuit that changes a voltage of a first node to the first low level based on an input signal and the first clock signal, and that changes a voltage of the first node to a second low level based on the second clock signal. A voltage level of the second low level may be lower than a voltage level of the first low level. Each of the plurality of stages may include a first output buffer that outputs the second clock signal as the input signal for a next one of the plurality of stages in response to the voltage of the first node, and a second output buffer that outputs, as a corresponding one of the active-high scan signals, the third clock signal in response to the voltage of the first node.

In an embodiment, the second clock signal output by the first output buffer may be provided as a corresponding one of the active-low scan signals to a corresponding row of pixels among the plurality of pixels. The plurality of stages may sequentially provide the active-low scan signals and the active-high scan signals to the plurality of pixels.

In an embodiment, the scan driver may include a plurality of P-type stages that may sequentially provide the active-low scan signals to the plurality of pixels, and the plurality of stages may sequentially provide the active-high scan signals to the plurality of pixels.

As described above, in a scan driver and a display device according to an embodiment, each stage may include a first output buffer that may output an active-low scan signal and a second output buffer that may output an active-high scan signal. Accordingly, compared with a conventional scan driver including separate stages that respectively output the active-low scan signal and the active-high scan signal, a size and power consumption of the scan driver according to an embodiment may be reduced.

BRIEF DESCRIPTION OF THE DRAWINGS

Illustrative, non-limiting embodiments will be more clearly understood from the following detailed description in conjunction with the accompanying drawings.

DETAILED DESCRIPTION OF THE EMBODIMENTS

Hereinafter, embodiments will be explained in detail with reference to the accompanying drawings.

The terms "a", "an" and "the" may refer to one or more than one of an element. Likewise, a particular quantity of an element may be described or shown while the actual quantity of the element may differ.

The terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element.

The phrase "at least one of" is intended to include the meaning of "at least one selected from the group of" for the purpose of its meaning and interpretation. For example, "at least one of A and B" may be understood to mean "A, B, or A and B." The terms "and" and "or" may be used in the conjunctive or disjunctive sense and may be understood to be equivalent to "and/or."

The terms "comprise," "comprising," "include", "including", "has", and/or "having" as used herein specify the presence of stated features or components, but do not preclude the presence or addition of one or more other features or components. It will be understood that when a feature or component is referred to as being "on", "over", "under" or the like with respect to another feature or component, it can be directly or indirectly on the other feature or component. That is, for example, intervening features or components may be present.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 1:
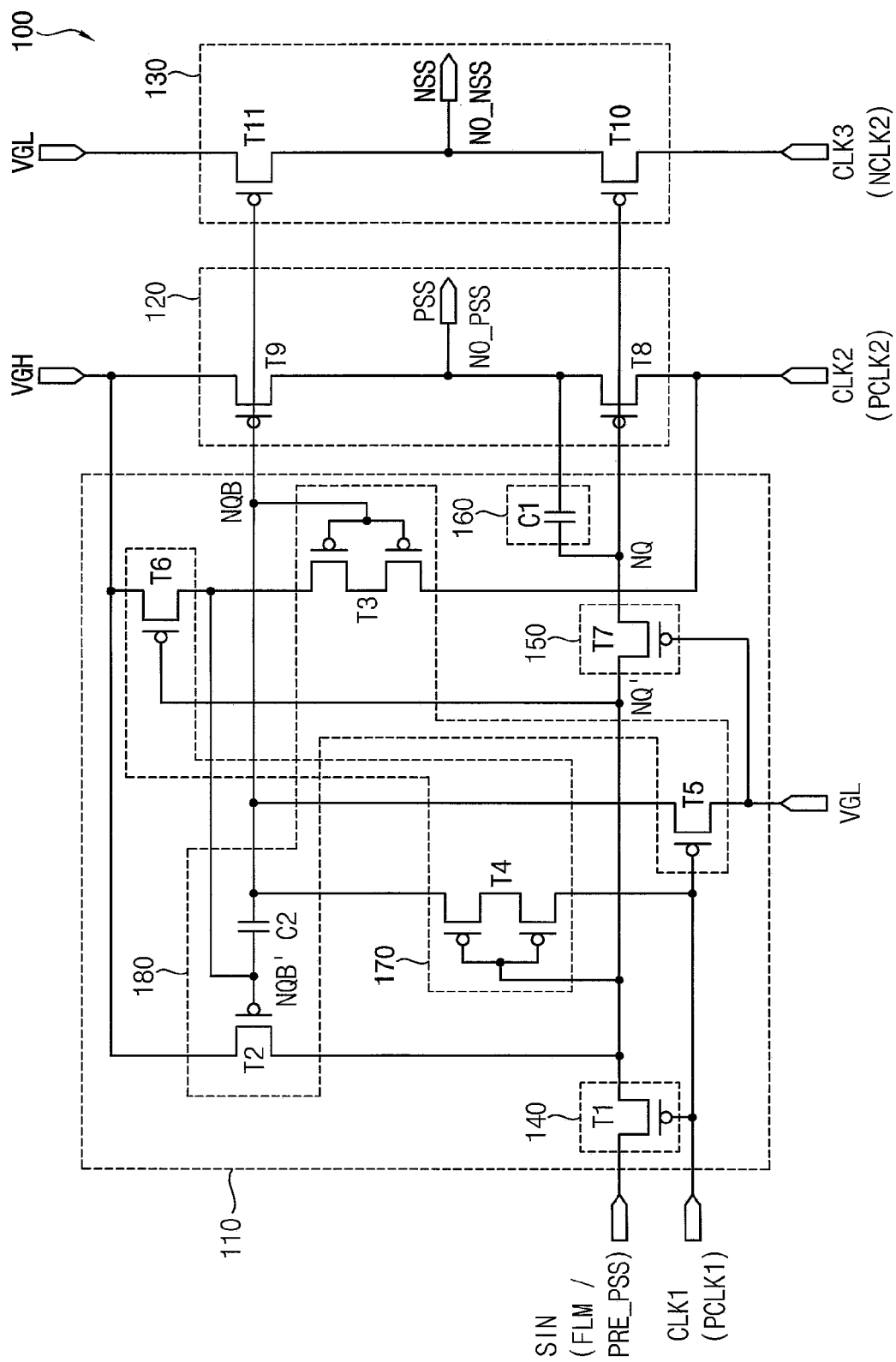
FIG. 1 is a schematic circuit diagram illustrating a stage included in a scan driver according to an embodiment.

FIG. 1 is a schematic circuit diagram illustrating a stage included in a scan driver according to an embodiment.

Referring to FIG. 1, each stage 100 included in a scan driver according to an embodiment may receive, as an input signal SIN, a scan start signal FLM or a previous active-low scan signal PRE_PSS output from a previous stage, may receive first and second clock signals CLK1 and CLK2 having a first low level as an active level, and may receive a third clock signal CLK3 having a high level as the active level. In an embodiment, among multiple stages included in the scan driver, odd-numbered stages may receive, as the first and second clock signals CLK1 and CLK2, first and second P-type clock signals PCLK1 and PCLK2 for PMOS transistors which may have difference phases (e.g., opposite phases) and may have the first low level as the active level. Even-numbered stages may receive the second and first P-type clock signals PCLK2 and PCLK1 as the first and second clock signals CLK1 and CLK2, respectively. Further, the odd-numbered stages may receive, as the third clock signal CLK3, a second N-type clock signal NCLK2 of first and second N-type clock signals NCLK1 and NCLK2 for NMOS transistors which may have difference phases (e.g., opposite phases) and may have the high level as the active level. The even-numbered stages may receive, as the third clock signal CLK3, a first N-type clock signal NCLK1 of the first and second N-type clock signals NCLK1 and NCLK2.

Each stage 100 included in the scan driver according to an embodiment may include a logic circuit 110 that may change a voltage of a first node NQ to the first low level based on the input signal SIN and the first clock signal CLK1, and may change the voltage of the first node NQ to a second low level based on the second clock signal CLK2. A voltage level of the second low level may be lower than a voltage level of the first low level. Each stage 100 may include a first output buffer 120 that may output the second clock signal CLK2 as an active-low scan signal PSS in response to the voltage of the first node NQ, and a second output buffer 130 that may output the third clock signal CLK3 as an active-high scan signal NSS in response to the voltage of the first node NQ.

As illustrated in FIG. 1, the logic circuit 110 may include an input part 140, a stress relaxing part 150, a bootstrap part 160, a holding part 170 and a stabilizer part 180.

The input part 140 may transfer the input signal to a third node NQ' in response to the first clock signal CLK1. In an embodiment, the stress relaxing part 150 may be disposed at a Q node, the Q node may be divided into the first node NQ and the third node NQ' by the stress relaxing part 150, and the input part 140 may be electrically connected (or coupled) to the third node NQ'. In an embodiment, the input part 140 may include a first transistor T1 including a gate receiving the first clock signal CLK1, a first terminal receiving the input signal SIN, and a second terminal electrically connected to the third node NQ'.

The stress relaxing part 150 may be disposed between the first node NQ and the third node NQ', and may transfer the input signal SIN from the third node NQ' to the first node NQ. By the input signal SIN transferred to the first node NQ, the voltage of the first node NQ may be changed to the first low level. In an embodiment, the stress relaxing part 150 may include a seventh transistor T7 including a gate receiving a low gate voltage VGL, a first terminal electrically connected to the third node NQ', and a second terminal electrically connected to the first node NQ.

The bootstrap part 160 may change the voltage of the first node NQ from the first low level to the second low level lower than the first low level by bootstrapping the first node NQ in response to the second clock signal CLK2. In an embodiment, a voltage level difference between the first low level and the second low level may correspond to, but is not limited to, a voltage level difference between the high level and the first low level. Further, in an embodiment, the bootstrap part 160 may include a first capacitor C1 including a first electrode electrically connected to a first output node NO_PSS at which the active-low scan signal PSS may be output, and a second electrode electrically connected to the first node NQ.

The holding part 170 may hold a second node NQB and a fourth node NQB' as the high level while the active-low scan signal PSS and the active-high scan signal NSS may be output. Here, a second capacitor C2 may be disposed at a QB node, and thus the QB node may be divided into the second node NQB and the fourth node NQB'. The holding part 170 may be electrically connected to the second node NQB and the fourth node NQB'. In an embodiment, the holding part 170 may include a fourth transistor T4 including a gate electrically connected to the third node NQ', a first terminal electrically connected to the second node NQB, and a second terminal receiving the first clock signal CLK1, and a sixth transistor T6 including a gate electrically connected to the third node NQ', a first terminal receiving a high gate voltage VGH, and a second terminal electrically connected to the fourth node NQB'. As illustrated in FIG. 1, the fourth transistor T4 may be implemented with, but is not limited to, two serially connected transistors.

After the active-low scan signal PSS and the active-high scan signal NSS may be output, the stabilizer part 180 may apply (or periodically apply) the high gate voltage VGH to the third node NQ' in response to a voltage of the fourth node NQB', and may change (or periodically change) a voltage of the second node NQB to the second low level. For example, the stabilizer part 180 may periodically apply the high gate voltage VGH to the third node NQ', the high gate voltage VGH applied to the third node NQ' may be transferred to the first node NQ by the seventh transistor T7, and thus the high gate voltage VGH may be periodically applied also to the first node NQ. In another example, the stabilizer part 180 may periodically apply the high gate voltage VGH to the first node NQ. Further, the stabilizer part 180 may periodically change the voltage of the second node NQB to the second low level, and thus the active-low scan signal PSS and the active-high scan signal NSS may be respectively stabilized to the high level and the low level (or the first low level) based on the voltage of the second node NQB having the second low level. In an embodiment, the stabilizer part 180 may include a second transistor T2 including a gate electrically connected to the fourth node NQB', a first terminal receiving the high gate voltage VGH, and a second terminal electrically connected to the third node NQ', a second capacitor C2 including a first electrode electrically connected to the fourth node NQB', and a second electrode electrically connected to the second node NQB, a third transistor T3 including a gate electrically connected to the second node NQB, a first terminal electrically connected to the fourth node NQB', and a second terminal receiving the second clock signal CLK2, and a fifth transistor T5 including a gate receiving the first clock signal CLK1, a first terminal electrically connected to the second node NQB, and a second terminal receiving the low gate voltage VGL. As illustrated in FIG. 1, the third transistor T3 may be implemented with, but is not limited to, two serially connected transistors.

The first output buffer 120 may be controlled by the voltage of the first node NQ and/or the voltage of the second node NQB, and may output the active-low scan signal PSS for PMOS transistors included in pixels. The active-low scan signal PSS may have the low level (or the first low level) as the active level. In an embodiment, the first output buffer 120 may include an eighth transistor T8 including a gate electrically connected to the first node NQ, a first terminal electrically connected to the first output node NO_PSS at which the active-low scan signal PSS may be output, and a second terminal receiving the second clock signal CLK2, and a ninth transistor T9 including a gate electrically connected to the second node NQB, a first terminal receiving the high gate voltage VGH, and a second terminal electrically connected to the first output node NO_PSS.

Similar to the first output buffer 120, the second output buffer 130 may be controlled by the voltage of the first node NQ and/or the voltage of the second node NQB. Further, the second output buffer 130 may output the active-high scan signal NSS for NMOS transistors included in the pixels. The active-high scan signal NSS may have the high level as the active level. In an embodiment, the second output buffer 130 may include a tenth transistor T10 including a gate electrically connected to the first node NQ, a first terminal electrically connected to a second output node NO_NSS at which the active-high scan signal NSS may be output, and a second terminal receiving the third clock signal CLK3, and an eleventh transistor T11 including a gate electrically connected to the second node NQB, a first terminal receiving the low gate voltage VGL, and a second terminal electrically connected to the second output node NO_NSS.

As illustrated in FIG. 1, the first through eleventh transistors T1 through T11 included in each stage 100 may be the same type of transistors, or the PMOS transistors T1 through T11. Thus, in the scan driver according to an embodiment, the stage 100 including only the PMOS transistors T1 through T11 may generate not only the active-low scan signal PSS for the PMOS transistors of the pixels, but also the active-high scan signal NSS for the NMOS transistors of the pixels.

As described above, in the scan driver according to an embodiment, each stage 100 may include the logic circuit 110 that may control the voltages of the first and second nodes NQ and NQB, the first output buffer 120 that may output the active-low scan signal PSS based on the voltages of the first and second nodes NQ and NQB, and the second output buffer 130 that may output the active-high scan signal NSS based on the voltages of the first and second nodes NQ and NQB. Accordingly, since the active-low scan signal PSS and the active-high scan signal NSS may be output by the single stage 100, a size and power consumption of the scan driver according to an embodiment may be reduced compared with a conventional scan driver including separate stages that respectively output the active-low scan signal PSS and the active-high scan signal NSS.

Hereinafter, an example of an operation of the stage 100 will be described below with reference to FIGS. 1 through 9.

Figure 2:
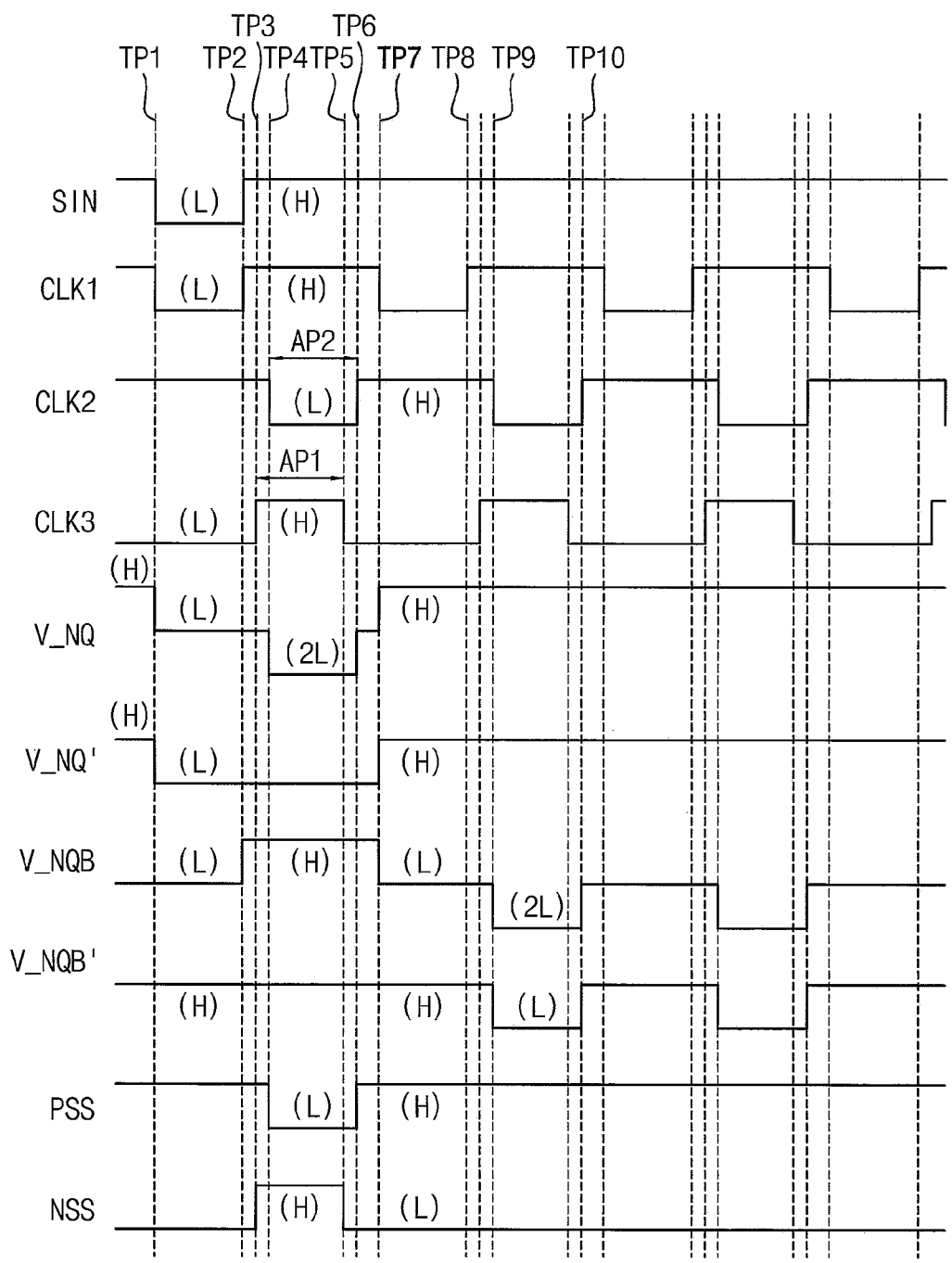
FIG. 2 is a schematic timing diagram for describing an example of an operation of a stage of FIG. 1.

FIG. 2 is a schematic timing diagram for describing an example of an operation of a stage of FIG. 1, and FIGS. 3 through 9 are schematic circuit diagrams for describing an example of an operation of a stage of FIG. 1.

Referring to FIGS. 1 and 2, each stage 100 may receive the input signal SIN and the first through third clock signals CLK1, CLK2 and CLK3. The input signal SIN may be the scan start signal FLM with respect to a first of the multiple stages included in the scan driver, and may be the previous active-low scan signal PRE_PSS with respect to the remaining multiple stages. Further, the first and second clock signals CLK1 and CLK2 may have difference phases (e.g., opposite phases), and may have the first low level L as the active level. The third clock signal CLK3 may have the high level H as the active level. In an embodiment, with respect to each of the first through third clock signals CLK1, CLK2 and CLK3, an active period (or an ON period) may be shorter than an inactive period (or an OFF period) as illustrated in FIG. 2. For example, a duty cycle of each of the first through third clock signals CLK1, CLK2 and CLK3 may be, but is not limited to, about 40%. In another example, the active period of each of the first through third clock signals CLK1, CLK2 and CLK3 may be longer than or equal to the inactive period.

Figure 3:
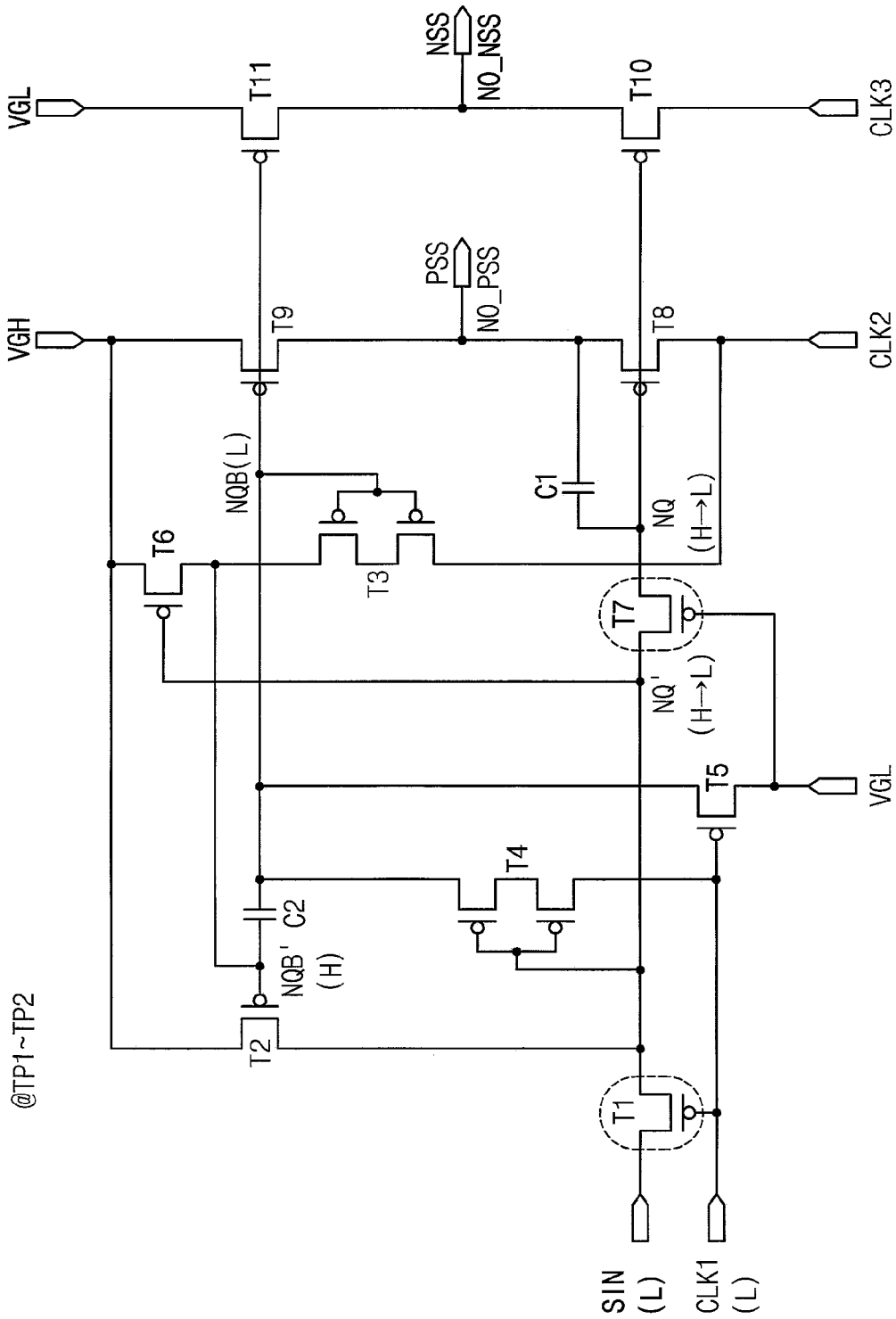
FIGS. 3 through 9 are schematic circuit diagrams for describing an example of an operation of a stage of FIG. 1.

In a period from a first time point TP1 to a second time point TP2, the input signal SIN having the first low level L may be applied, and the first clock signal CLK1 having the first low level L may be applied. As illustrated in FIG. 3, the first transistor T1 may be turned on in response to the first clock signal CLK1 having the first low level L, and the seventh transistor T7 may be turned on in response to the low gate voltage VGL having the first low level L. The input signal SIN may be transferred by the turned-on first transistor T1 to the third node NQ', and thus the voltage V_NQ' of the third node NQ' may be changed from the high level H to the first low level L. Further, the input signal SIN at the third node NQ' may be transferred by the turned-on seventh transistor T7 to the first node NQ, and thus the voltage V_NQ of the first node NQ may be changed from the high level H to the first low level L.

Figure 4:
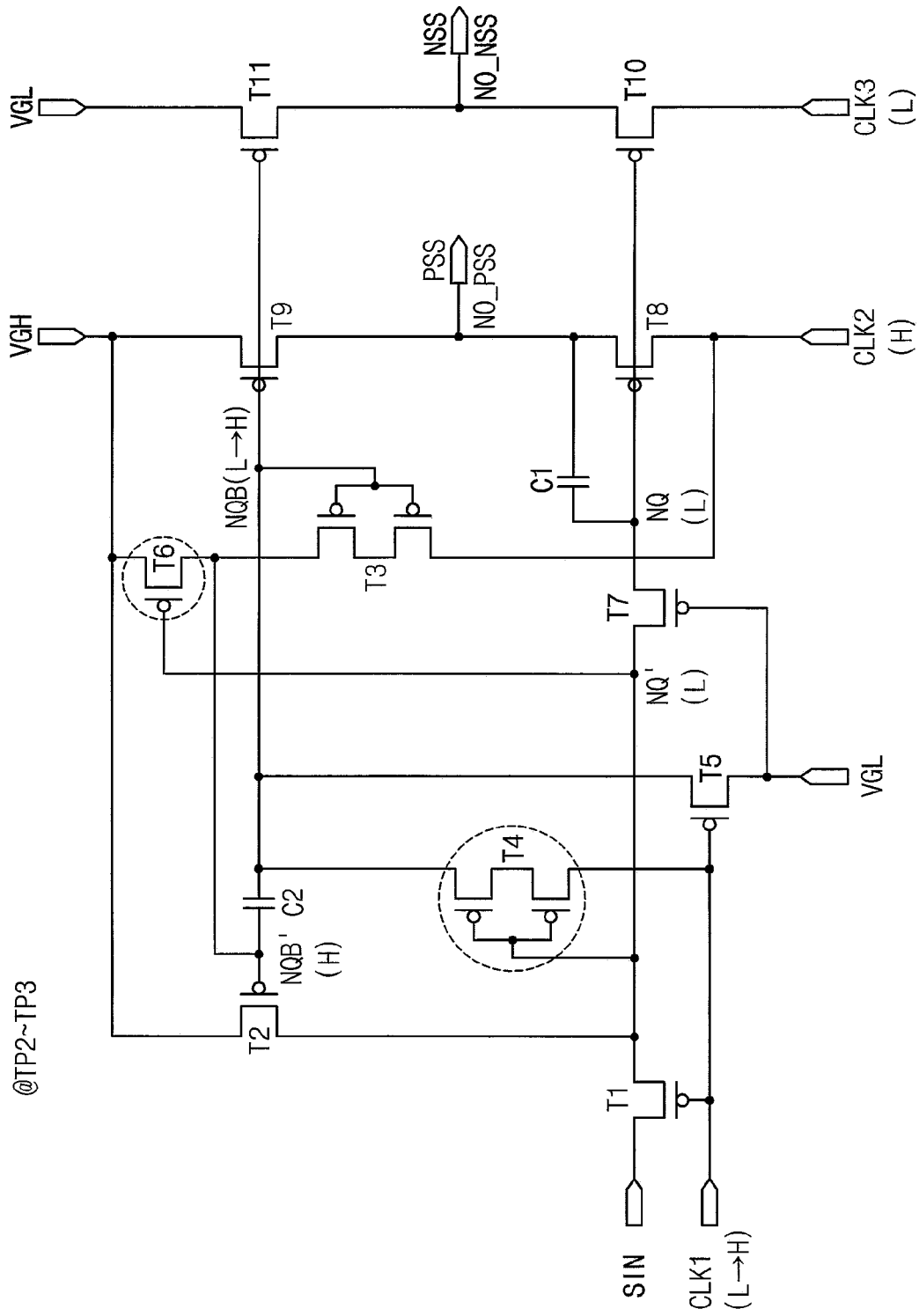

The first clock signal CLK1 may be changed from the first low level L to the high level H at the second time point TP2, and the first clock signal CLK1 having the high level H may be applied in a period from the second time point TP2 to a third time point TP3. As illustrated in FIG. 4, the fourth transistor T4 and the sixth transistor T6 may be turned on in response to the voltage V_NQ' of the third node NQ' having the first low level L. The first clock signal CLK1 having the high level H may be transferred by the turned-on fourth transistor T4 to the second node NQB, and the voltage V_NQB of the second node NQB may be changed from the first low level L to the high level H. Further, the turned-on sixth transistor T6 may apply the high gate voltage VGH to the fourth node NQB', or the first electrode of the second capacitor C2, and the turned-on fourth transistor T4 may apply the first clock signal CLK1 having the high level H to the second node NQB, or the second electrode of the second capacitor C2. Accordingly, the second capacitor C2 may be initialized or discharged.

Figure 5:
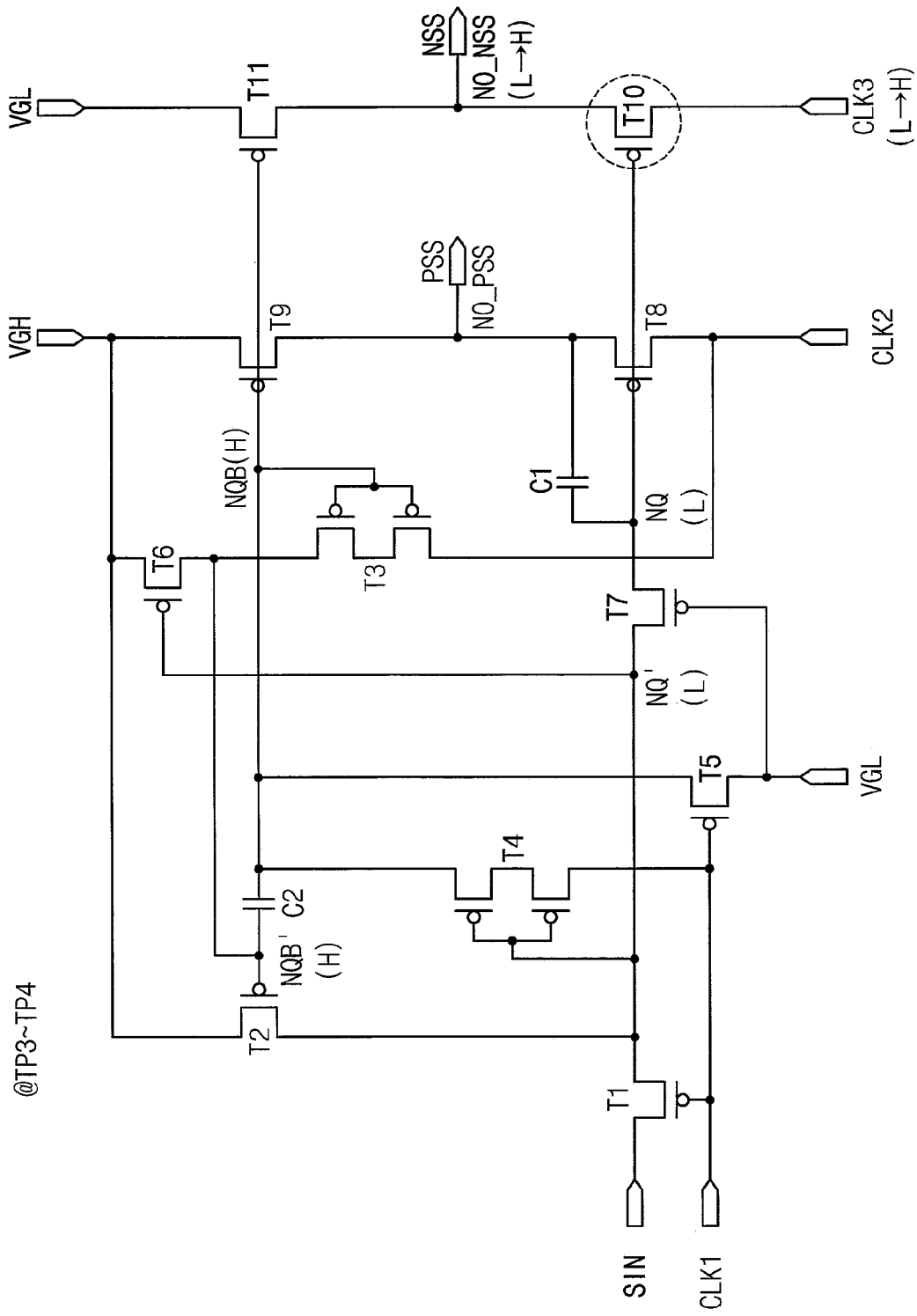

The third clock signal CLK3 may be changed from the first low level L to the high level H at the third time point TP3, and the third clock signal CLK3 having the high level H may be applied in a period from the third time point TP3 to a fourth time point TP4. As illustrated in FIG. 5, the tenth transistor T10 may be turned on in response to the voltage V_NQ of the first node NQ having the first low level L, and the third clock signal CLK3 having the high level H may be output by the turned-on tenth transistor T10 as the active-high scan signal NSS having the high level H at the second output node NO_NSS.

Figure 6:
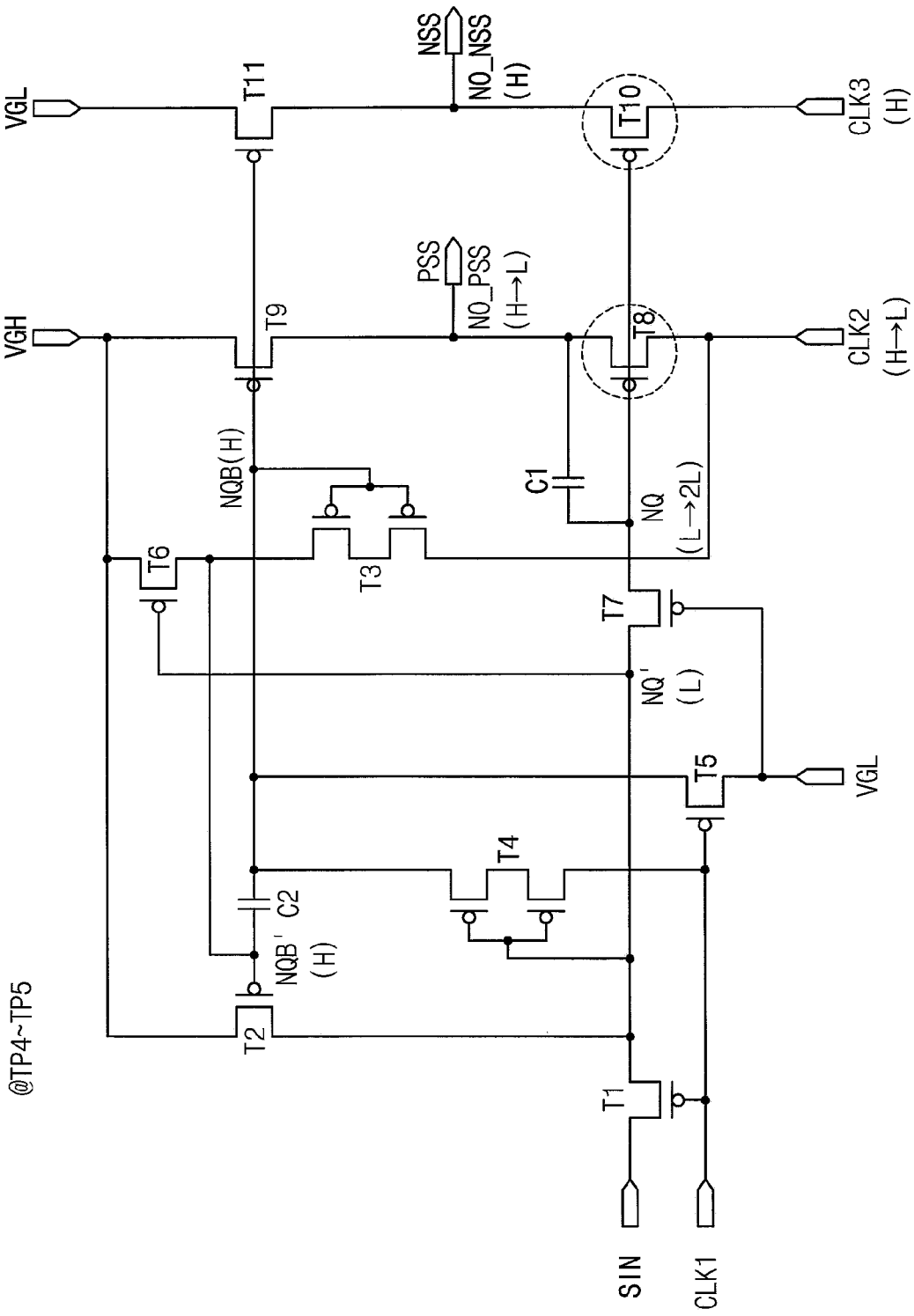

The second clock signal CLK2 may be changed from the high level H to the first low level L at the fourth time point TP4, and the second clock signal CLK2 having the first low level L may be applied in a period from the fourth time point TP4 to a fifth time point TP5. As illustrated in FIG. 6, the eighth transistor T8 may be turned on in response to the voltage V_NQ of the first node NQ, and the second clock signal CLK2 having the first low level L may be output by the turned-on eighth transistor T8 as the active-low scan signal PSS having the first low level L at the first output node NO_PSS. If the second clock signal CLK2 having the first low level L is applied to the first output node NO_PSS through the turned-on eighth transistor T8, a voltage of the first output node NO_PSS, or a voltage of the first electrode of the first capacitor C1 may be changed from the high level H to the first low level L. If the voltage of the first electrode of the first capacitor C1 is changed from the high level H to the first low level L, a voltage of the second electrode of the first capacitor C1, or the voltage V_NQ of the first node NQ may be changed from the first low level L to the second low level 2L lower than the first low level L. In an embodiment, a voltage level difference between the first low level L and the second low level 2L may correspond to, but is not limited to, a voltage level difference between the high level H and the first low level L. Here, an operation that changes the voltage V_NQ of the first node NQ from the first low level L to the second low level 2L may be referred to as a bootstrap operation, and the first capacitor C1 may be referred to as a bootstrap capacitor.

In a case where the stage 100 may not include the seventh transistor T7, or in a case where the first node NQ and the third node NQ' may be the same node, if the voltage V_NQ of the first node NQ is changed from the first low level L to the second low level 2L, the voltage V_NQ of the first node NQ having a high absolute value may be applied to transistors T1, T2, T4 and T6 electrically connected (e.g., directly) to the third node NQ'. In particular, since a voltage having the high level H may be applied to first terminals of the transistors T1, T2, T4 and T6, and a voltage having the second low level 2L may be applied to second terminals of the transistors T1, T2, T4 and T6, a high voltage stress may be applied to the transistors T1, T2, T4 and T6. However, in the stage 100 of the scan driver according to an embodiment, although the voltage V_NQ of the first node NQ may have the second low level 2L, the low gate voltage VGL having the first low level L higher than the second low level 2L may be applied to the gate of the seventh transistor T7, and thus the voltage V_NQ of the first node NQ may not be transferred to the third node NQ'. Accordingly, the voltage stress applied to the transistors T1, T2, T4 and T6 electrically connected (e.g., directly) to the third node NQ' may be reduced. Thus, the seventh transistor T7 may be referred to as a stress relaxing (or relieving) transistor.

Further, while the active-low scan signal PSS and the active-high scan signal NSS may be output, by the fourth and sixth transistors T4 and T6 having the gates receiving the voltage V_NQ' of the third node NQ', the voltage V_NQB of the second node NQB and the voltage V_NQB' of the second node NQB' may be held or maintained as the high level H. Thus, while the active-low scan signal PSS and the active-high scan signal NSS may be output, the ninth and eleventh transistors T9 and T11 may not be turned on based on the voltage V_NQB of the second node NQB having the high level H.

Figure 7:
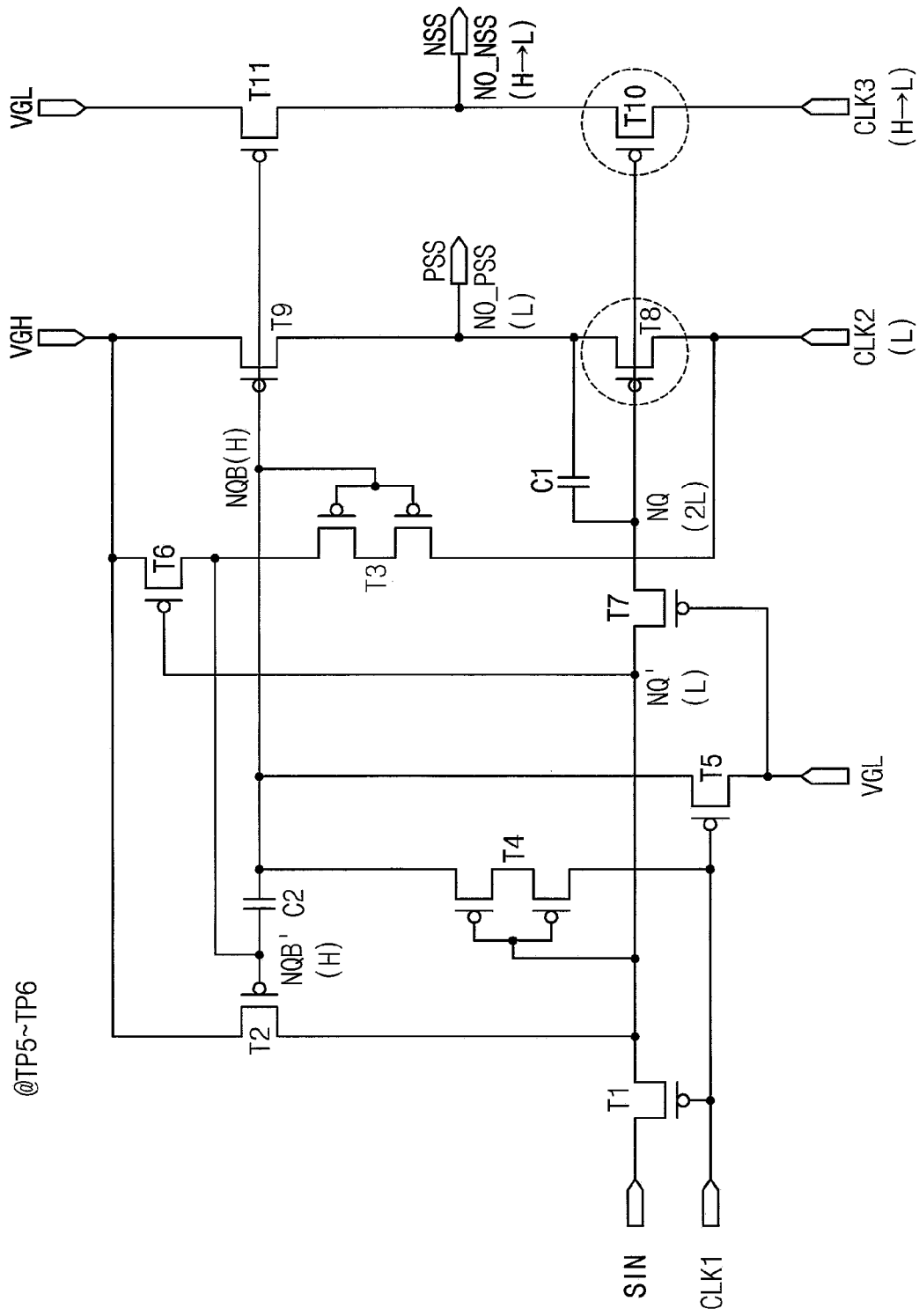

The third clock signal CLK3 may be changed from the high level H to the first low level L at the fifth time point TP5, and the third clock signal CLK3 having the first low level L may be applied in a period from the fifth time point TP5 to a sixth time point TP6. As illustrated in FIG. 7, the turned-on state of the tenth transistor T10 may be maintained in response to the voltage V_NQ of the first node NQ having the second low level 2L, and the active-high scan signal NSS at the second output node NO_NSS may be changed by the turned-on tenth transistor T10 from the high level H that may be the active level (or an ON level) to the first low level L that may be an inactive level (or an OFF level). To maintain the turned-on state of the tenth transistor T10 although the third clock signal CLK3 applied to the second terminal of the tenth transistor T10 may have the first low level L, a voltage having a voltage level lower than the first low level L should be applied to the gate of the tenth transistor T10. In the stage 100 according to an embodiment, since the third clock signal CLK3 may be changed to the first low level L in case that the voltage V_NQ of the first node NQ applied to the gate of the tenth transistor T10 may have the second low level 2L lower than the first low level L, the turned-on state of the tenth transistor T10 may be maintained, and the active-high scan signal NSS may be changed to the first low level L that may be the inactive level (or the OFF level).

In an embodiment, to change third clock signal CLK3 to the first low level L while the voltage V_NQ of the first node NQ may have the second low level 2L, a rising edge (e.g., the third time point TP3) of the third clock signal CLK3 may lag a falling edge (e.g., the first time point TP1) of the first clock signal CLK1, and a falling edge (e.g., the fifth time point TP5) of the third clock signal CLK3 may lead a rising edge (e.g., the sixth time point TP6) of the second clock signal CLK2. Further, as illustrated in FIG. 2, an active period AP1 of the third clock signal CLK3 from the rising edge (e.g., the third time point TP3) of the third clock signal CLK3 to the falling edge (e.g., the fifth time point TP5) of the third clock signal CLK3 may not be the same as an active period AP2 of the second clock signal CLK2 from a falling edge (e.g., the fourth time point TP4) of the second clock signal CLK2 to the rising edge (e.g., the sixth time point TP6) of the second clock signal CLK2, and the active period AP1 of the third clock signal CLK3 may overlap (e.g., partially overlap) the active period AP2 of the second clock signal CLK2. For example, the falling edge (e.g., the fifth time point TP5) of the third clock signal CLK3 may lag the falling edge (e.g., the fourth time point TP4) of the second clock signal CLK2, and may lead the rising edge (e.g., the sixth time point TP6) of the second clock signal CLK2. Accordingly, the active-high scan signal NSS having the high level H may be output at the rising edge (e.g., the third time point TP3) of the third clock signal CLK3, and the active-high scan signal NSS may be changed to the first low level L that may be the inactive level (or the OFF level) at the falling edge (e.g., the fifth time point TP5) of the third clock signal CLK3.

If the second clock signal CLK2 is changed to the high level H at the sixth time point TP6, the active-low scan signal PSS at the first output node NO_PSS may be changed to the high level H that may be the inactive level (or the OFF level). If the voltage of the first output node NO_PSS, or the voltage of the first electrode of the first capacitor C1 is changed from the first low level L to the high level H, the voltage of the second electrode of the first capacitor C1, or the voltage V_NQ of the first node NQ may be changed from the second low level 2L to the first low level L.

Figure 8:
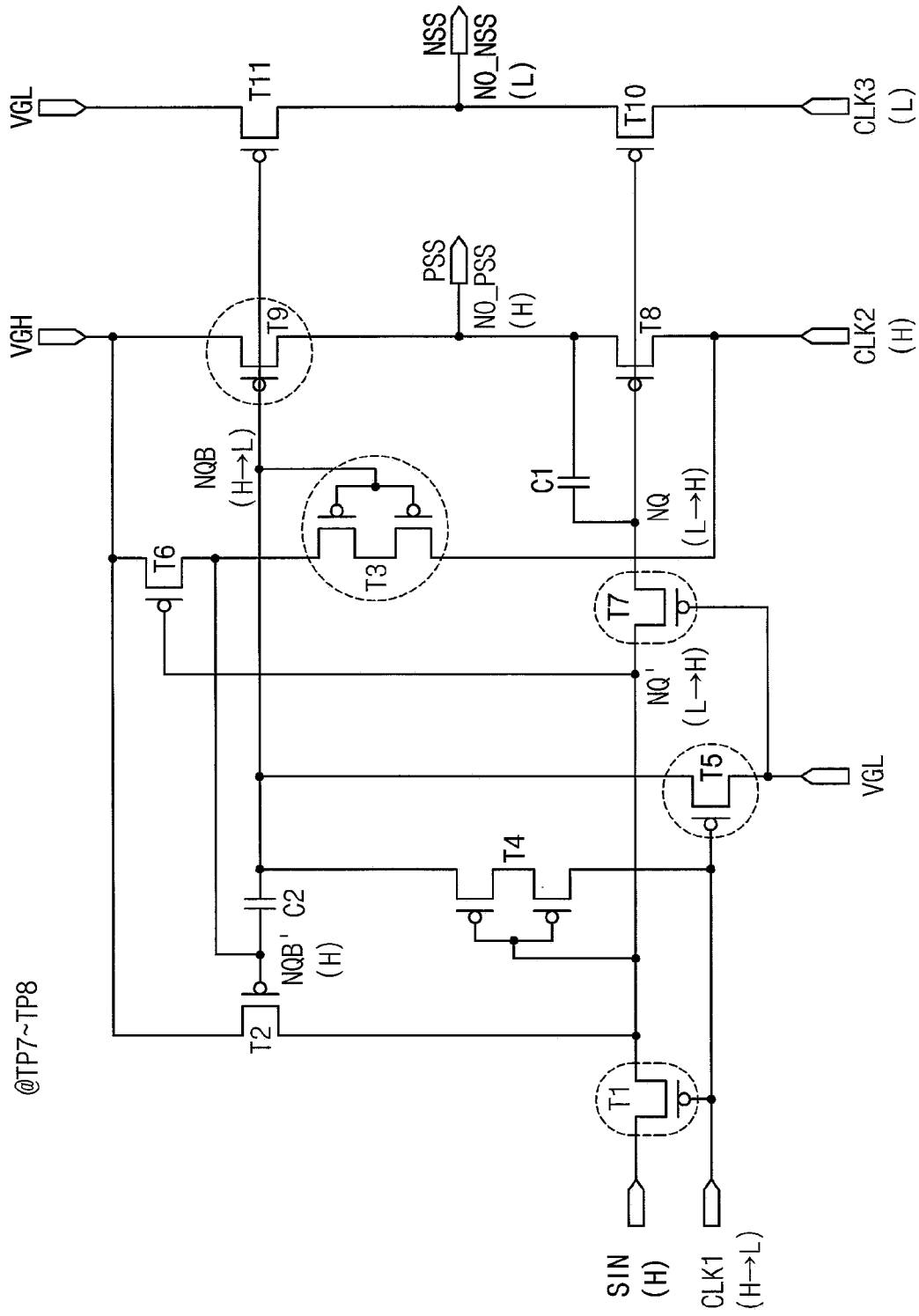

The first clock signal CLK1 may be changed from the high level H to the first low level L at a seventh time point TP7, and the first clock signal CLK1 having the first low level L may be applied in a period from the seventh time point TP7 to an eighth time point TP8. As illustrated in FIG. 8, the first transistor T1 and the fifth transistor T5 may be turned on in response to the first clock signal CLK1 having the first low level L, and the seventh transistor T7 may be turned on in response to the low gate voltage VGL having the first low level L. The voltage V_NQ' of the third node NQ' may be changed by the turned-on first transistor T1 from the first low level L to the high level H, and the voltage V_NQ of the first node NQ may be changed by the turned-on seventh transistor T7 from the first low level L to the high level H. Further, the voltage V_NQB of the second node NQB may be changed by the turned-on fifth transistor T5 from the high level H to the first low level L. The third transistor T3 and the ninth transistor T9 may be turned on in response to the voltage V_NQB of the second node NQB having the first low level L. The second clock signal CLK2 having the high level H may be transferred by the turned-on third transistor T3 to the third node NQB'. Thus, the first electrode of the second capacitor C2 may have a voltage having the high level H, and the second electrode of the second capacitor C2 may have a voltage having the first low level L. Further, the active-low scan signal PSS at the first output node NO_PSS may be stabilized to the high level H that may be the inactive level (or the OFF level).

Figure 9:
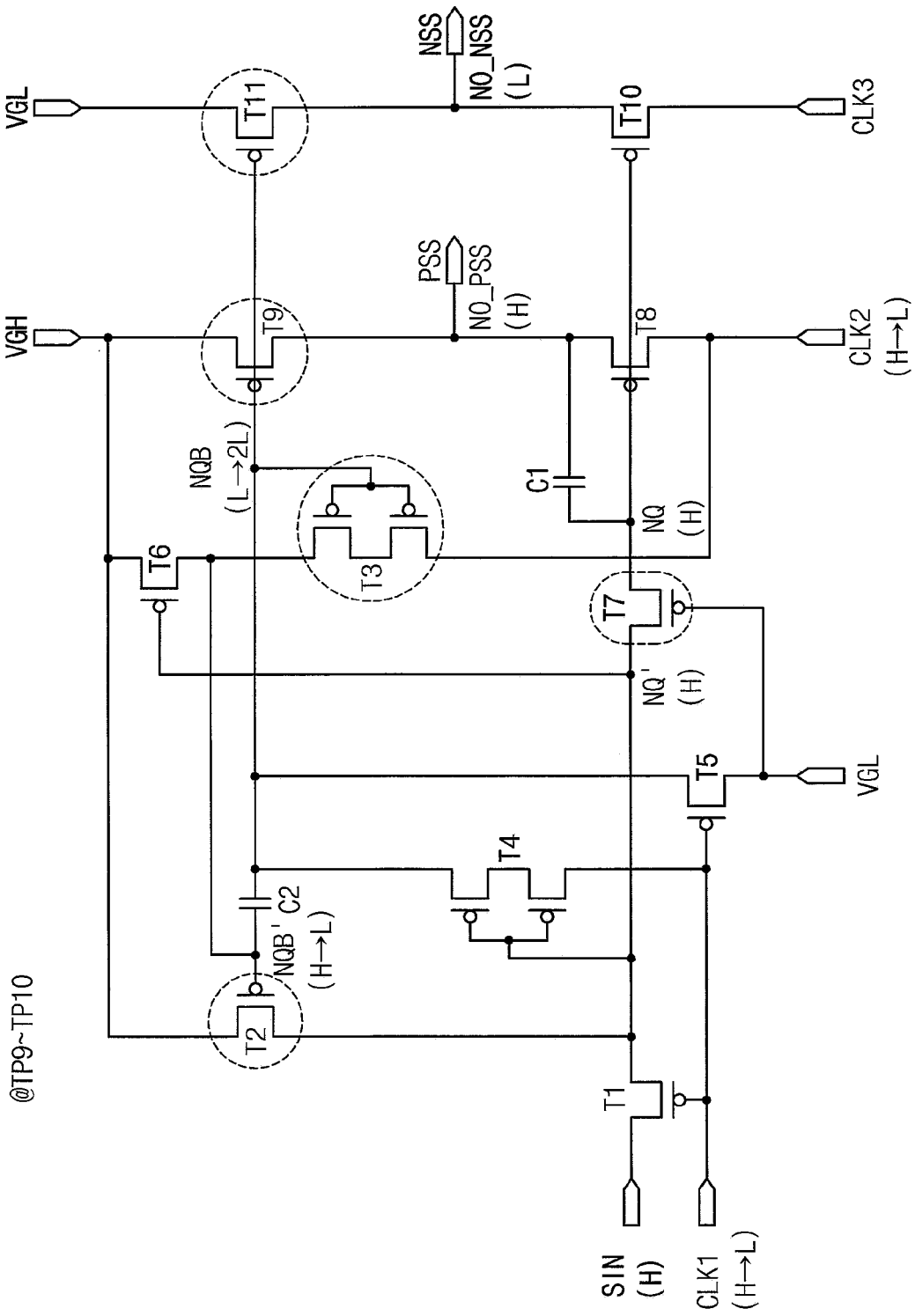

The second clock signal CLK2 may be changed from the high level H to the first low level L at a ninth time point TP9, and the second clock signal CLK2 having the first low level L may be applied in a period from the ninth time point TP9 to a tenth time point TP10. As illustrated in FIG. 9, the second clock signal CLK2 having the first low level L may be applied to the fourth node NQB' through the turned-on third transistor T3, and the voltage V_NQB' of the fourth node NQB', or a voltage of the first electrode of the second capacitor C2 may be changed from the high level H to the first low level L. If the voltage of the first electrode of the second capacitor C2 is changed from the high level H to the first low level L, a voltage of the second electrode of the second capacitor C2, or the voltage V_NQB of the second node NQB may be changed from the first low level L to the second low level 2L. Here, an operation that changes the voltage V_NQB of the second node NQB from the first low level L to the second low level 2L may be referred to as a bootstrap operation, and the second capacitor C2 also may be referred to as a bootstrap capacitor. If the voltage V_NQB of the second node NQB may have the second low level 2L, the ninth and eleventh transistors T9 and T11 may be fully turned on, and the active-low scan signal PSS and the active-high scan signal NSS at the first and second output nodes NO_PSS and NO_NSS may be stabilized by the turned-on ninth and eleventh transistors T9 and T11 to the high level H and the first low level L that may be the inactive level (or the OFF level), respectively. Further, the second transistor T2 may be turned on in response to the voltage V_NQB' of the fourth node NQB' having the first low level L, and the seventh transistor T7 may be turned on in response to the low gate voltage VGL having the first low level L. The high gate voltage VGH may be applied by the turned-on second transistor T2 to the third node NQ', and the voltage V_NQ' of the third node NQ' may be stabilized to the high level H. Further, the voltage V_NQ of the first node NQ may be stabilized by the turned-on seventh transistor T7 to the high level H. As described above, the second transistor T2 may apply the high gate voltage VGH to the third node NQ' periodically (or each time the second clock signal CLK2 may have the first low level L) in response to the voltage V_NQB' of the fourth node NQB', and the fifth transistor T5, the second capacitor C2 and the third transistor T3 may change the voltage V_NQB of the second node NQB to the second low level 2L periodically (or each time the second clock signal CLK2 may have the first low level L). Accordingly, after the active-low scan signal PSS and the active-high scan signal NSS having the active level (or the ON level) may be output, the active-low scan signal PSS and the active-high scan signal NSS may be stabilized to the high level H and the first low level L that may be the inactive level (or the OFF level), respectively.

As described above, in a scan driver according to an embodiment, each stage 100 may output not only an active-low scan signal PSS having a first low level L as the active level, but also an active-high scan signal NSS having a high level H as the active level. Accordingly, a size and power consumption of the scan driver according to an embodiment may be reduced.

Figure 10:
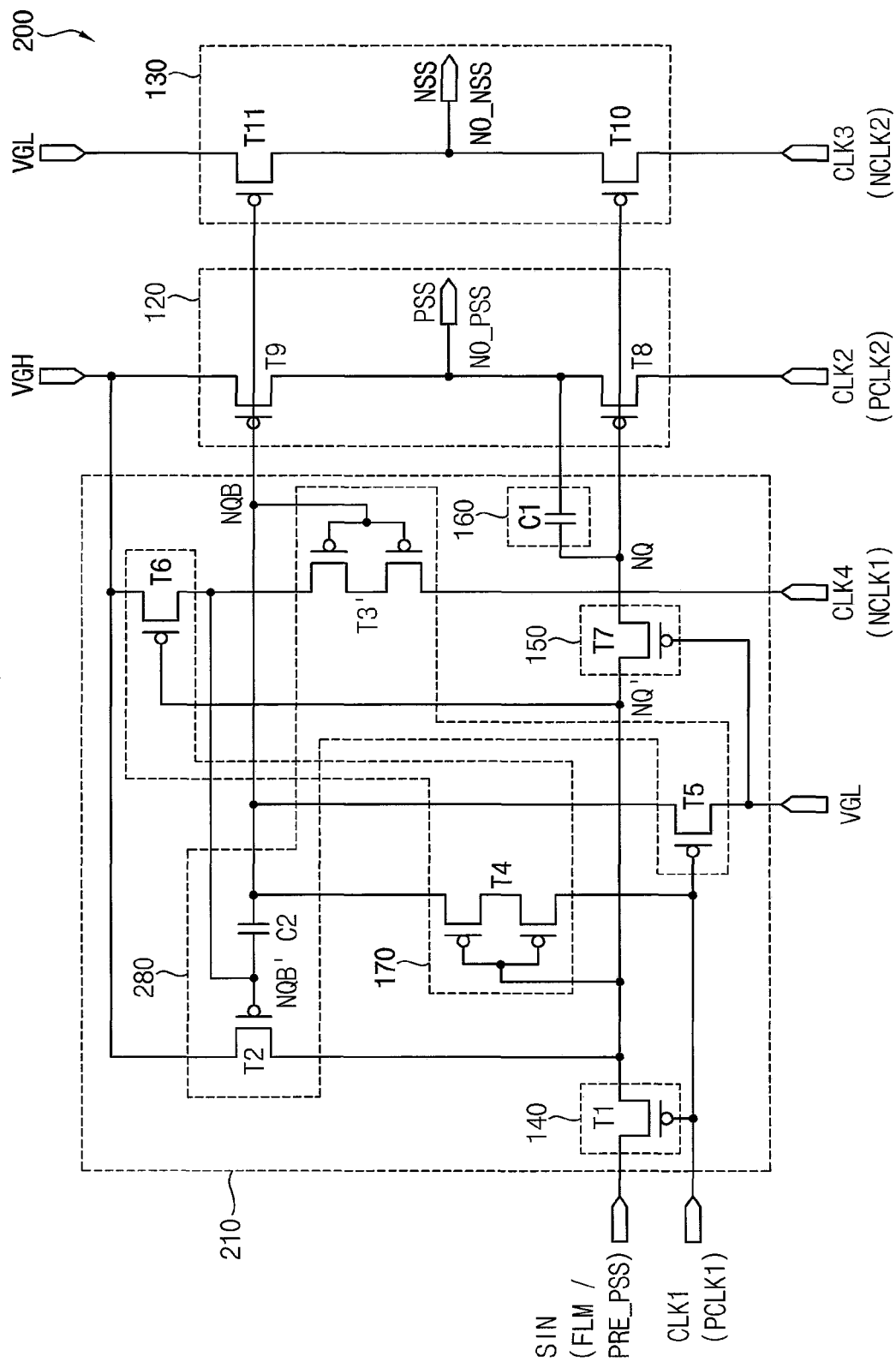
FIG. 10 is a schematic circuit diagram illustrating a stage included in a scan driver according to an embodiment.

FIG. 10 is a schematic circuit diagram illustrating a stage included in a scan driver according to an embodiment.

Referring to FIG. 10, each stage 200 included in a scan driver according to an embodiment may include a logic circuit 210, a first output buffer 120 that may output an active-low scan signal PSS, and a second output buffer 130 that may output an active-high scan signal NSS. In an embodiment, the logic circuit 210 may include an input part 140, a stress relaxing part 150, a bootstrap part 160, a holding part 170 and a stabilizer part 280. The stage 200 of FIG. 10 may have a similar configuration and a similar operation to a stage 100 of FIG. 1, except that the stabilizer part 280 of the logic circuit 210 may receive a fourth clock signal CLK4 instead of a second clock signal CLK2.

The stage 200 may receive first and second clock signals CLK1 and CLK2 having a first low level as an active level and a third clock signal CLK3 having a high level as the active level, and may further receive a fourth clock signal CLK4 having the high level as the active level and having a phase different from that of the third clock signal CLK3. In an embodiment, the first and second clock signals CLK1 and CLK2 may be first and second P-type clock signals PCLK1 and PCLK2 for PMOS transistors which have difference phases (e.g., opposite phases) and may have the first low level as the active level, and the third and fourth clock signals CLK3 and CLK4 may be first and second N-type clock signals NCLK1 and NCLK2 for NMOS transistors which may have difference phases (e.g., opposite phases) and may have the high level as the active level. Further, in an embodiment, each of the first through fourth clock signals CLK1, CLK2, CLK3 and CLK4 may have a duty cycle less than or equal to about 50%. For example, the duty cycle of each of the first through fourth clock signals CLK1, CLK2, CLK3 and CLK4 may be, but is not limited to, about 40%. An inactive period of the fourth clock signal CLK4 that may be the N-type clock signal, or a low level period of the fourth clock signal CLK4 may be longer than an active period of the second clock signal CLK2 that may be the P-type clock signal, or a low level period of the second clock signal CLK2.

As illustrated in FIG. 10, the stabilizer part 280 of the logic circuit 210 may include a second transistor T2 including a gate electrically connected to a fourth node NQB', a first terminal receiving a high gate voltage VGH, and a second terminal electrically connected to a third node NQ', a second capacitor C2 including a first electrode electrically connected to the fourth node NQB', and a second electrode electrically connected to a second node NQB, a third transistor T3' including a gate electrically connected to the second node NQB, a first terminal electrically connected to the fourth node NQB', and a second terminal receiving the fourth clock signal CLK4, and a fifth transistor T5 including a gate receiving the first clock signal CLK1, a first terminal electrically connected to the second node NQB, and a second terminal receiving a low gate voltage VGL. During the low level period of the fourth clock signal CLK4, the stabilizer part 280 including the second transistor T2, the second capacitor C2, the third transistor T3' and the fifth transistor T5 may change a voltage of the second node NQB to a second low level lower than the first low level. If the voltage of the second node NQB is changed to the second low level, the active-low scan signal PSS and the active-high scan signal NSS may be stabilized by ninth and eleventh transistors T9 and T11 to the high level and the first low level that may be an inactive level, respectively. The low level period of the fourth clock signal CLK4 may be longer than the low level period of the second clock signal CLK2, and thus the active-low scan signal PSS and the active-high scan signal NSS may be further stabilized in the stage 200 of FIG. 10 compared with the stage 100 of FIG. 1.

Figure 11:
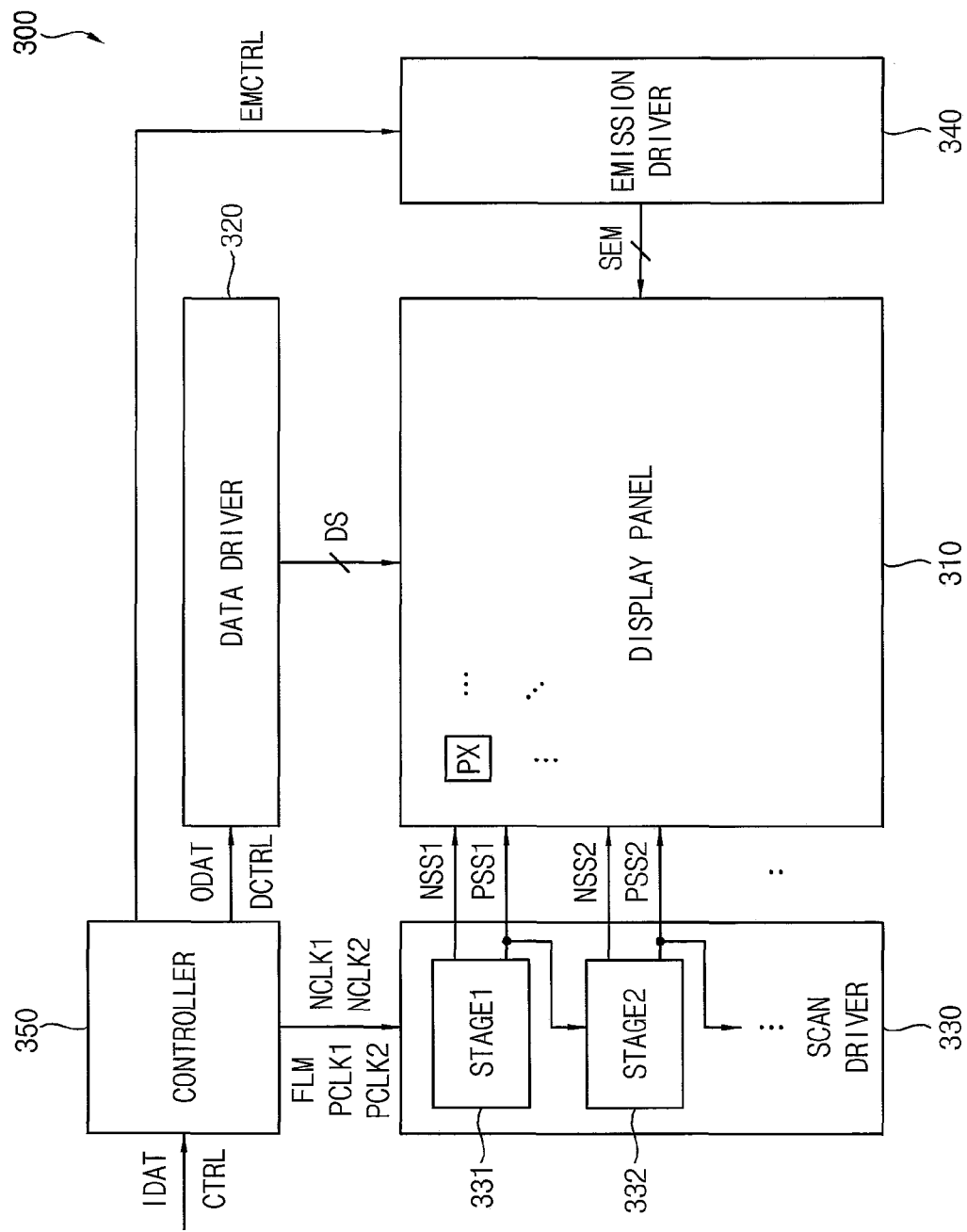
FIG. 11 is a schematic block diagram illustrating a display device including a scan driver according to an embodiment.
Figure 12:
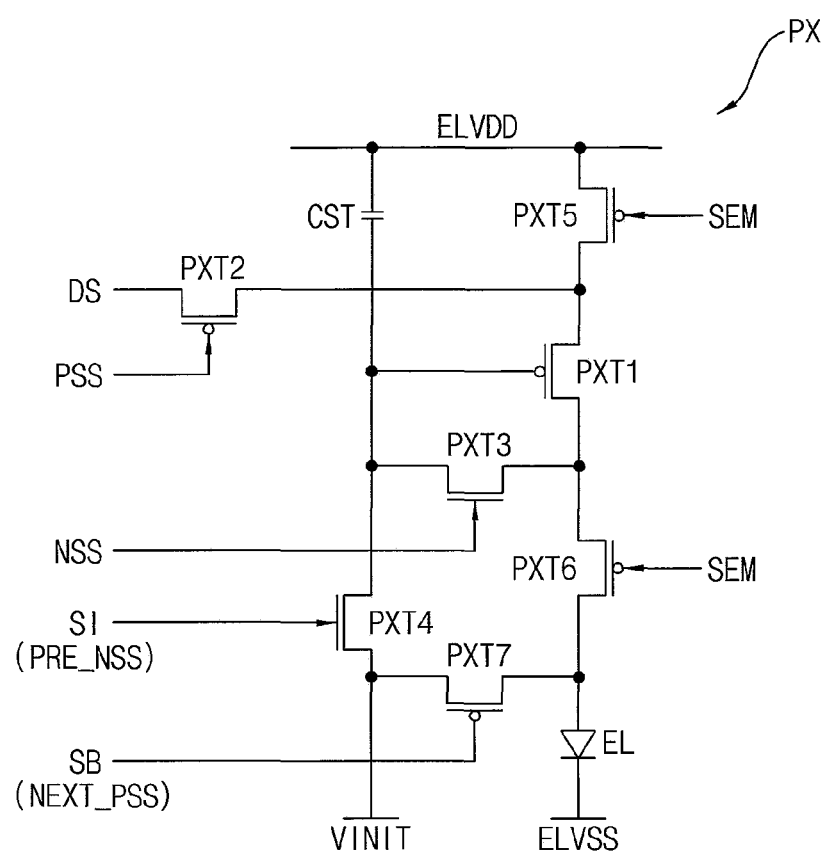
FIG. 12 is a schematic circuit diagram illustrating an example of a pixel included in a display device according to an embodiment.
Figure 13:
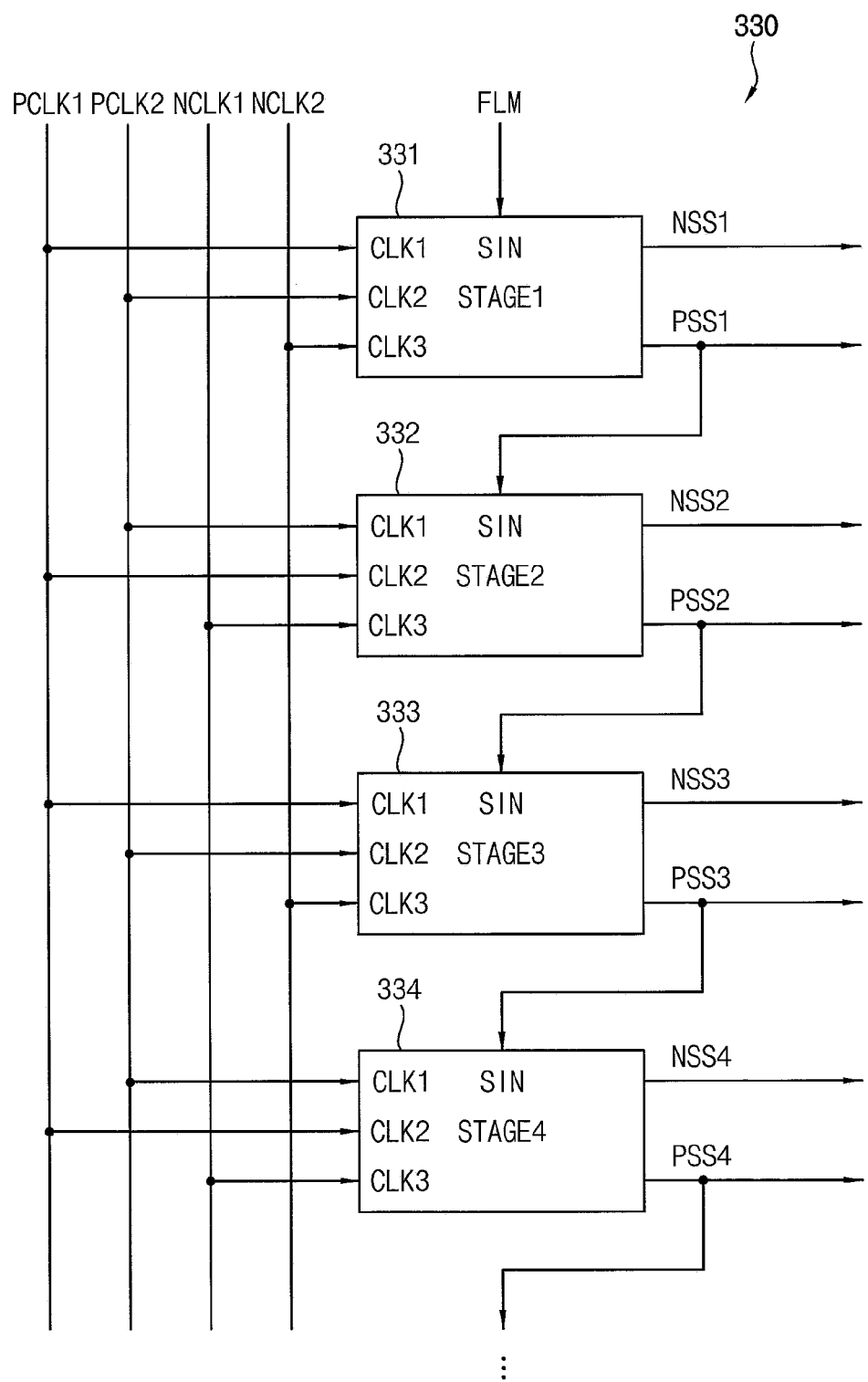
FIG. 13 is a schematic block diagram illustrating a scan driver included in a display device of FIG. 10 according to an embodiment.
Figure 14:
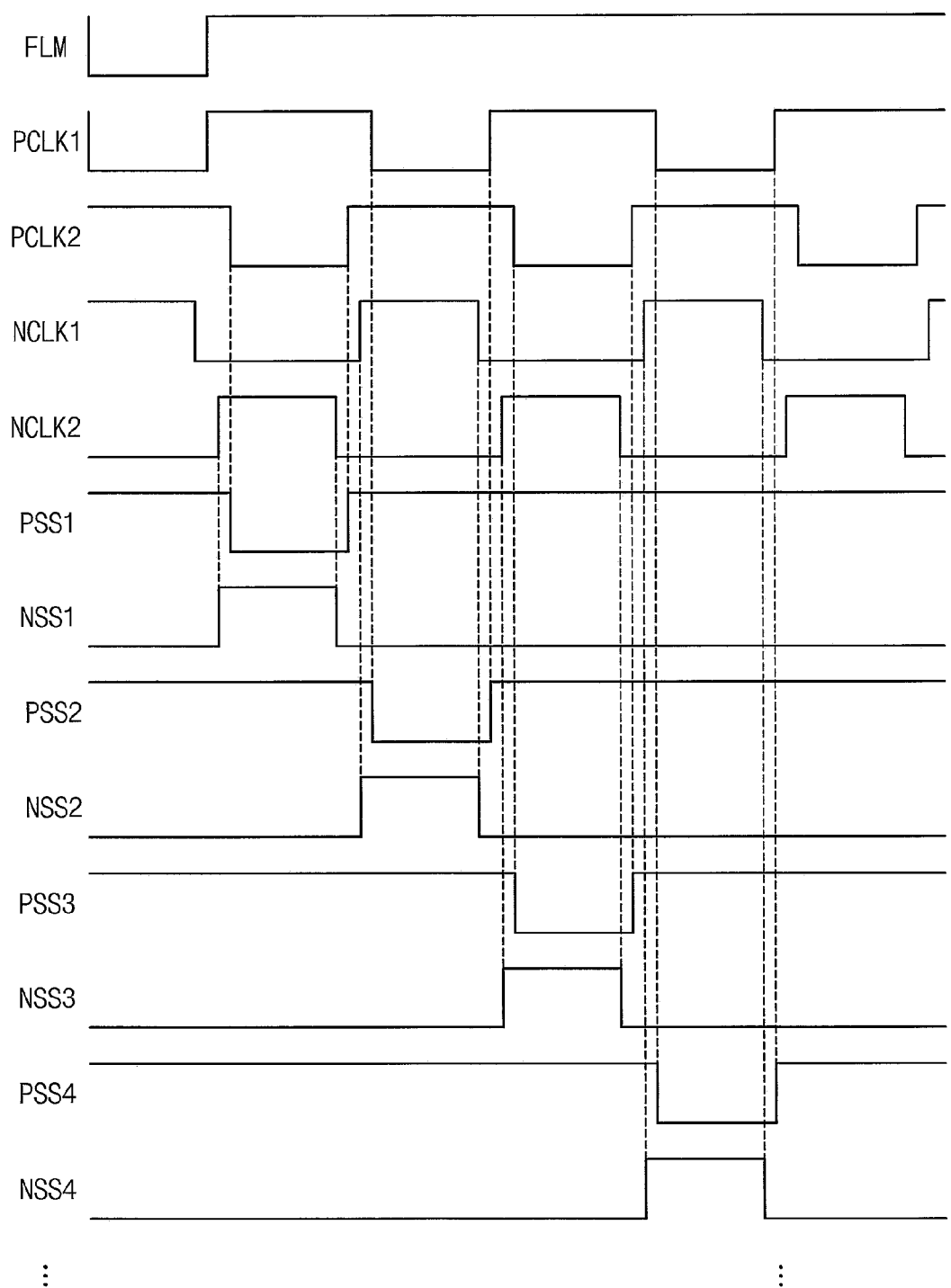
FIG. 14 is a schematic timing diagram for describing an example of an operation of a scan driver according to an embodiment.

FIG. 11 is a schematic block diagram illustrating a display device including a scan driver according to an embodiment, FIG. 12 is a schematic circuit diagram illustrating an example of a pixel included in a display device according to an embodiment, FIG. 13 is a schematic block diagram illustrating a scan driver included in a display device of FIG. 10 according to an embodiment, and FIG. 14 is a schematic timing diagram for describing an example of an operation of a scan driver according to an embodiment.

Referring to FIG. 11, a display device 300 according to an embodiment may include a display panel 310 that may include pixels PX, a data driver 320 that may provide data signals DS to the pixels PX, a scan driver 330 that may provide active-low scan signals PSS1, PSS2, . . . and active-high scan signals NSS1, NSS2, . . . to the pixels PX, and a controller 350 that may control the data driver 320 and the scan driver 330. In an embodiment, the display device 300 may further include an emission driver 340 that may provide emission signals SEM to the pixels PX.

The display panel 310 may include data signal lines, active-low scan signal lines, active-high scan signal lines, emission signal lines, and the pixels PX electrically connected thereto. In an embodiment, each pixel PX may include at least one capacitor, at least two transistors and an organic light emitting diode (OLED), and the display panel 310 may be an OLED display panel. Further, in an embodiment, each pixel PX may include different types of transistors suitable for low frequency driving capable of reducing power consumption. For example, each pixel PX may include at least one a low-temperature polycrystalline silicon (LTPS) PMOS transistor, and at least one oxide NMOS transistor.

For example, as illustrated in FIG. 12, each pixel PX may include a driving transistor PXT1 that may generate a driving current, a switching transistor PXT2 that may transfer the data signal DS from the data driver 320 to a first terminal of the driving transistor PXT1 in response to the active-low scan signal PSS from the scan driver 330, a compensating transistor PXT3 that may diode-connect the driving transistor PXT1 in response to the active-high scan signal NSS from the scan driver 330, a storage capacitor CST that may store the data signal DS transferred through the switching transistor PXT2 and the diode-connected driving transistor PXT1, a first initializing transistor PXT4 that may provide an initialization voltage VINIT to the storage capacitor CST and a gate of the driving transistor PXT1 in response to an initialization signal SI (or an active-high scan signal PRE_NSS for the pixels PX in a previous pixel row) from the scan driver 330, a first emission transistor PXT5 that may connect a line of a high power supply voltage ELVDD to the first terminal of the driving transistor PXT1 in response to the emission signal SEM from the emission driver 340, a second emission transistor PXT6 that may connect a second terminal of the driving transistor PXT1 to an organic light emitting diode EL in response to the emission signal SEM from the emission driver 340, a second initializing transistor (or a bypass transistor) PXT7 that may provide the initialization voltage VINIT to the organic light emitting diode EL in response to a bypass signal SB (or an active-low scan signal NEXT_PSS for the pixels PX in another (e.g., a next) pixel row) from the scan driver 330, and the organic light emitting diode EL that emits light based on the driving current from the line of the high power supply voltage ELVDD to a line of a low power supply voltage ELVSS.

At least a first of the driving transistor PXT1, the switching transistor PXT2, the compensating transistor PXT3, the first initializing transistor PXT4, the first emission transistor PXT5, the second emission transistor PXT6 and the second initializing transistor PXT7 may be implemented with a PMOS transistor, and at least a second of the driving transistor PXT1, the switching transistor PXT2, the compensating transistor PXT3, the first initializing transistor PXT4, the first emission transistor PXT5, the second emission transistor PXT6 and the second initializing transistor PXT7 may be implemented with an NMOS transistor. For example, as illustrated in FIG. 12, the compensating transistor PXT3 and the first initializing transistor PXT4 may be implemented with the NMOS transistors, and other transistors PXT1, PXT2, PXT5, PXT6 and PXT7 may be implemented with the PMOS transistors. The active-high signals NSS and PRE_NSS may be applied to the compensating transistor PXT3 and the first initializing transistor PXT4. Since the transistors PXT3 and PXT4 electrically connected (e.g., directly) to the storage capacitor CST and may be implemented with the NMOS transistors, a leakage current from the storage capacitor CST may be reduced, and thus the pixel PX may be suitable for low frequency driving. Although FIG. 12 illustrates an example where the compensating transistor PXT3 and the first initializing transistor PXT4 may be implemented with the NMOS transistors, a configuration of each pixel PX may not be limited to the example of FIG. 12. In another example, the display panel 310 may be a liquid crystal display (LCD) panel, or the like.

The data driver 320 may generate the data signals DS based on output image data ODAT and a data control signal DCTRL received from the controller 350, and may provide the data signals DS to the pixels PX through the data signal lines. In an example, the data control signal DCTRL may include, but is not limited to, an output data enable signal, a horizontal start signal and a load signal. In an embodiment, the data driver 320 and the controller 350 may be implemented with a single integrated circuit, and the single integrated circuit may be referred to as a timing controller embedded data driver (TED). In another embodiment, the data driver 320 and the controller 350 may be implemented with separate integrated circuits.

The scan driver 330 may generate the active-low scan signals PSS1, PSS2, . . . and the active-high scan signals NSS1, NSS2, . . . based on a scan control signal that may be received from the controller 350, and may provide the active-low scan signals PSS1, PSS2, . . . and the active-high scan signals NSS1, NSS2, . . . to the pixels PX through the active-low scan signal lines and the active-high scan signal lines. In an embodiment, the scan control signal may include, but is not limited to, a scan start signal FLM, first and second P-type clock signals PCLK1 and PCLK2, and first and second N-type clock signals NCLK1 and NCLK2. In an embodiment, the scan driver 330 may be integrated or formed in a peripheral portion of the display panel 310. In another example, the scan driver 330 may be implemented with one or more integrated circuits.

As illustrated in FIG. 13, the scan driver 330 may include multiple stages 331, 332, 333, 334, . . . that may output the active-low scan signals PSS1, PSS2, . . . and the active-high scan signals NSS1, NSS2, In an embodiment, each stage (e.g., 331) may output the active-low scan signal (e.g., PSS1) for a P-type transistor (e.g., the PMOS transistor) and the active-high scan signal (e.g., NSS1) for an N-type transistor (e.g., the NMOS transistor), and thus may be referred to as an NP-integrated stage.

The multiple stages 331, 332, 333, 334, . . . may receive the scan start signal FLM, may receive the first and second P-type clock signals PCLK1 and PCLK2 having a low level as an active level and having different phases (e.g., opposite phases), and may further receive the first and second N-type clock signals NCLK1 and NCLK2 having a high level as the active level and having different phases (e.g., opposite phases). A first 331 of the multiple stages 331, 332, 333, 334, . . . may receive the scan start signal FLM as an input signal SIN, and the remaining multiple stages 332, 333, 334, . . . may receive, as the input signals SIN, the active-low scan signals PSS1, PSS2, PSS3, PSS4, . . . from previous stages. In an embodiment, odd-numbered stages 331, 333, . . . may receive, as a first clock signal CLK1, a second clock signal CLK2 and a third clock signal CLK3, the first P-type clock signal PCLK1, the second P-type clock signal PCLK2 and the second N-type clock signal NCLK2, respectively. Even-numbered stages 332, 334, . . . may receive, as the first clock signal CLK1, the second clock signal CLK2 and the third clock signal CLK3, the second P-type clock signal PCLK2, the first P-type clock signal PCLK1 and the first N-type clock signal NCLK1, respectively.

According to an embodiment, each of the multiple stages 331, 332, 333, 334, . . . may have a similar configuration to a configuration of a stage 100 of FIG. 1, a configuration of a stage 200 of FIG. 10, or the like. For example, each of the multiple stages 331, 332, 333, 334, . . . may include a logic circuit that may change a voltage of a first node to a first low level based on the input signal SIN and the first clock signal CLK1, and may change the voltage of the first node to a second low level lower than the first low level based on the second clock signal CLK2, a first output buffer that may output the second clock signal as the input signal SIN for another (e.g., the next stage (i.e., a carry signal)) and/or a corresponding one of the active-low scan signals PSS1, PSS2, PSS3, PSS4, . . . in response to the voltage of the first node, and a second output buffer that may output the third clock signal CLK3 as a corresponding one of the active-high scan signals NSS1, NSS2, NSS3, NSS4 . . . in response to the voltage of the first node.

As illustrated in FIGS. 13 and 14, a first stage 331 may output a first active-high scan signal NSS1 to a first pixel row in synchronization with the second N-type clock signal NCLK2, and may output a first active-low scan signal PSS1 to the first pixel row in synchronization with the second P-type clock signal PCLK2. Further, a second stage 332 may output a second active-high scan signal NSS2 to a second pixel row in synchronization with the first N-type clock signal NCLK1, and may output a second active-low scan signal PSS2 to the second pixel row in synchronization with the first P-type clock signal PCLK1. Further, a third stage 333 may output a third active-high scan signal NSS3 to a third pixel row in synchronization with the second N-type clock signal NCLK2, and may output a third active-low scan signal PSS3 to the third pixel row in synchronization with the second P-type clock signal PCLK2. Further, a fourth stage 334 may output a fourth active-high scan signal NSS4 to a fourth pixel row in synchronization with the first N-type clock signal NCLK1, and may output a fourth active-low scan signal PSS4 to the fourth pixel row in synchronization with the first P-type clock signal PCLK1. In this manner, the multiple stages 331, 332, 333, 334, . . . may sequentially output the active-low scan signals PSS1, PSS2, PSS3, PSS4 . . . to the pixels PX on a pixel row basis, and may sequentially output the active-high scan signals NSS1, NSS2, NSS3, NSS4 . . . to the pixels PX on a pixel row basis.

The emission driver 340 may generate the emission signals SEM based on an emission control signal EMCTRL received from the controller 350, and may provide the emission signals SEM to the pixels PX through the emission signal lines. In an embodiment, the emission signals SEM may be sequentially provided to the pixels PX on a pixel row basis. In another example, the emission signals SEM may be a global signal that may be substantially simultaneously provided to the pixels PX. In an embodiment, the emission driver 340 may be integrated or formed in the peripheral portion of the display panel 310. In another example, the emission driver 340 may be implemented with one or more integrated circuits.

The controller (e.g., a timing controller (TCON)) 350 may receive input image data IDAT and a control signal CTRL from an external host (e.g., a graphic processing unit (GPU) or a graphic card). In an embodiment, the control signal CTRL may include, but is not limited to, a vertical synchronization signal, a horizontal synchronization signal, an input data enable signal, a master clock signal, or the like. The controller 350 may generate the output image data ODAT, the data control signal DCTRL, the scan control signal and the emission control signal EMCTRL based on the input image data IDAT and the control signal CTRL. The controller 350 may control an operation of the data driver 320 by providing the output image data ODAT and the data control signal DCTRL to the data driver 320, may control an operation of the scan driver 330 by providing the scan control signal to the scan driver 330, and may control an operation of the emission driver 340 by providing the emission control signal EMCTRL to the emission driver 340.

As described above, in the display device 300 according to an embodiment, each stage (e.g., 331) of a scan driver 330 may output an active-low scan signal (e.g., PSS1) and an active-high scan signal (e.g., NSS1). Accordingly, a size and power consumption of the scan driver 330 of the display device 300 according to an embodiment may be reduced compared with a conventional scan driver including separate stages that respectively output an active-low scan signal and an active-high scan signal.

Figure 15:
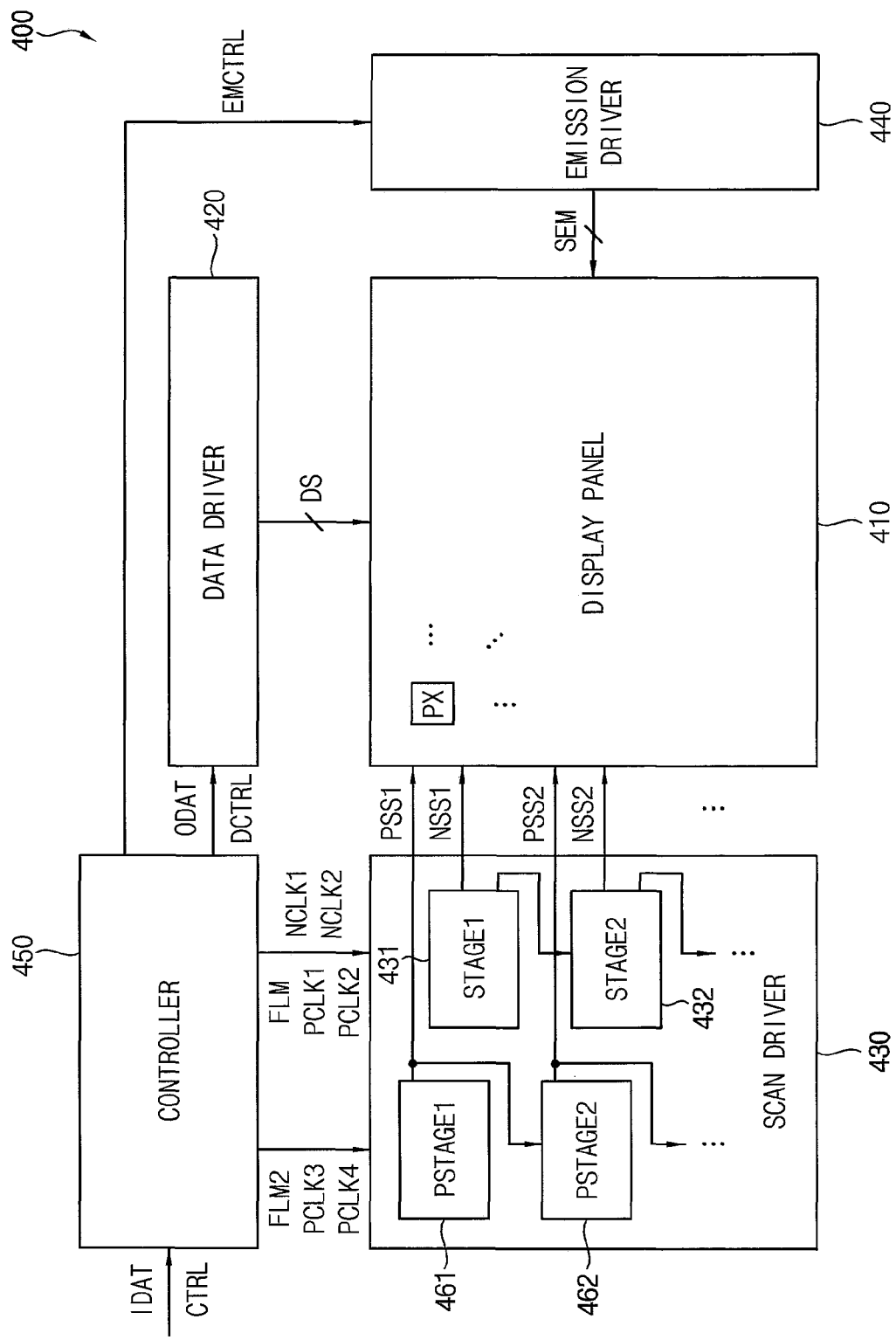
FIG. 15 is a schematic block diagram illustrating a display device including a scan driver according to an embodiment.
Figure 16:
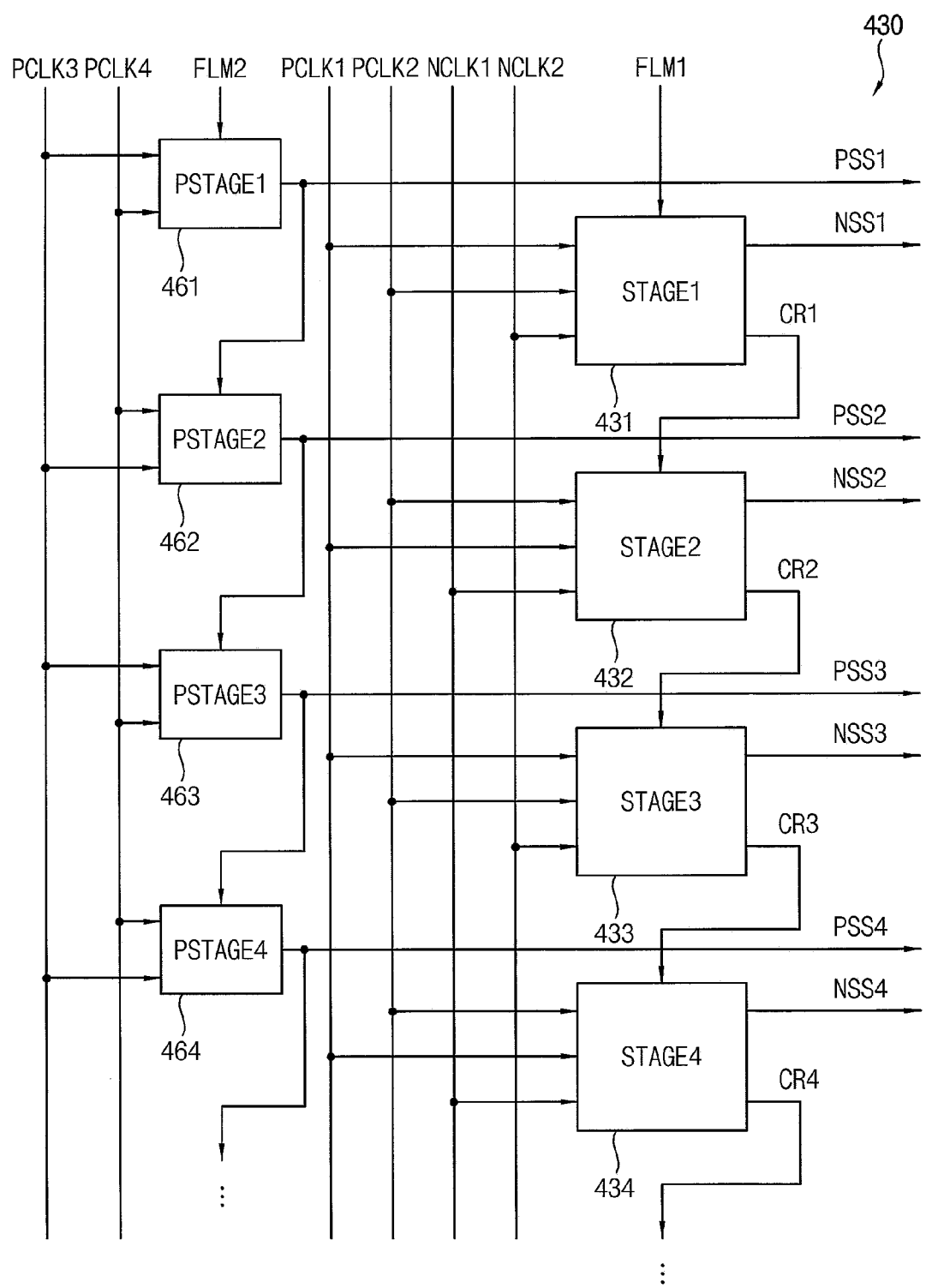
FIG. 16 is a schematic block diagram illustrating a scan driver included in a display device of FIG. 15 according to an embodiment.
Figure 17:
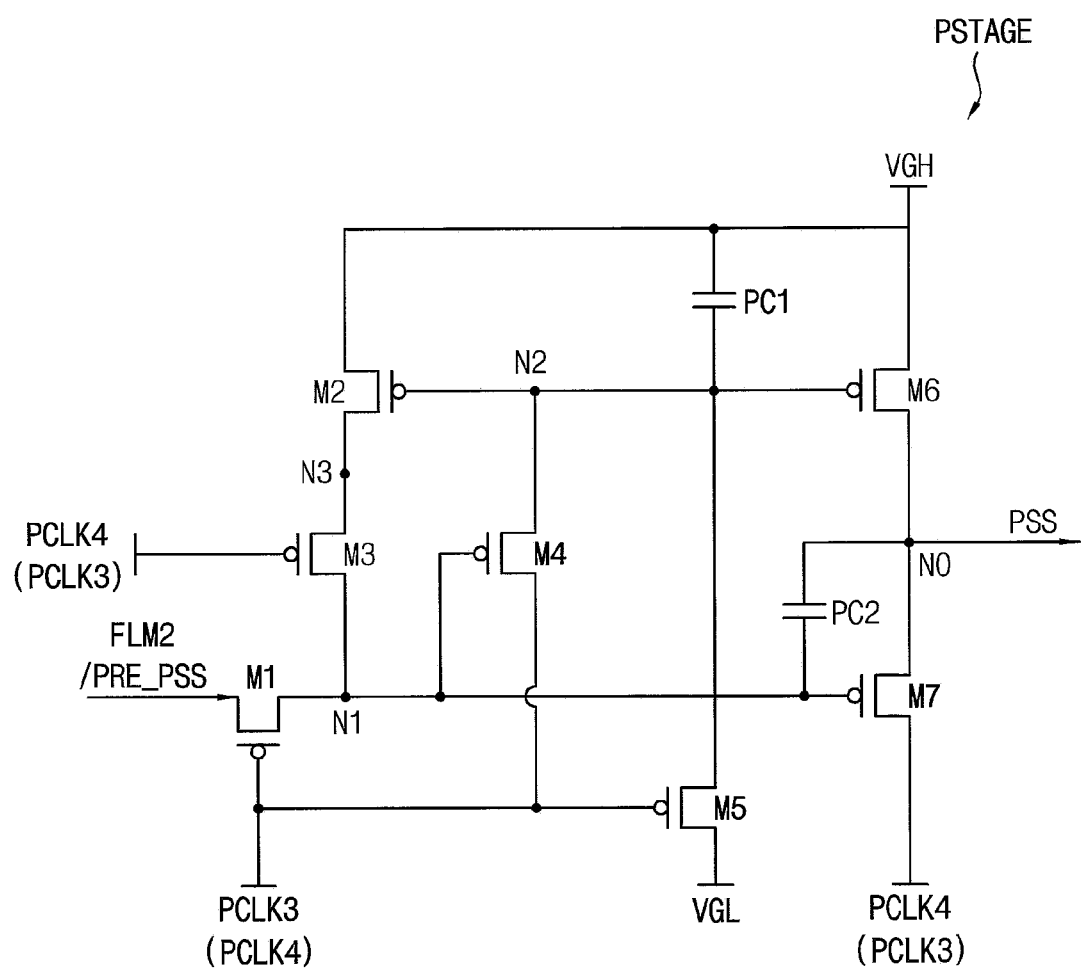
FIG. 17 is a schematic circuit diagram illustrating a P-type stage included in a scan driver of FIG. 16.
Figure 18:
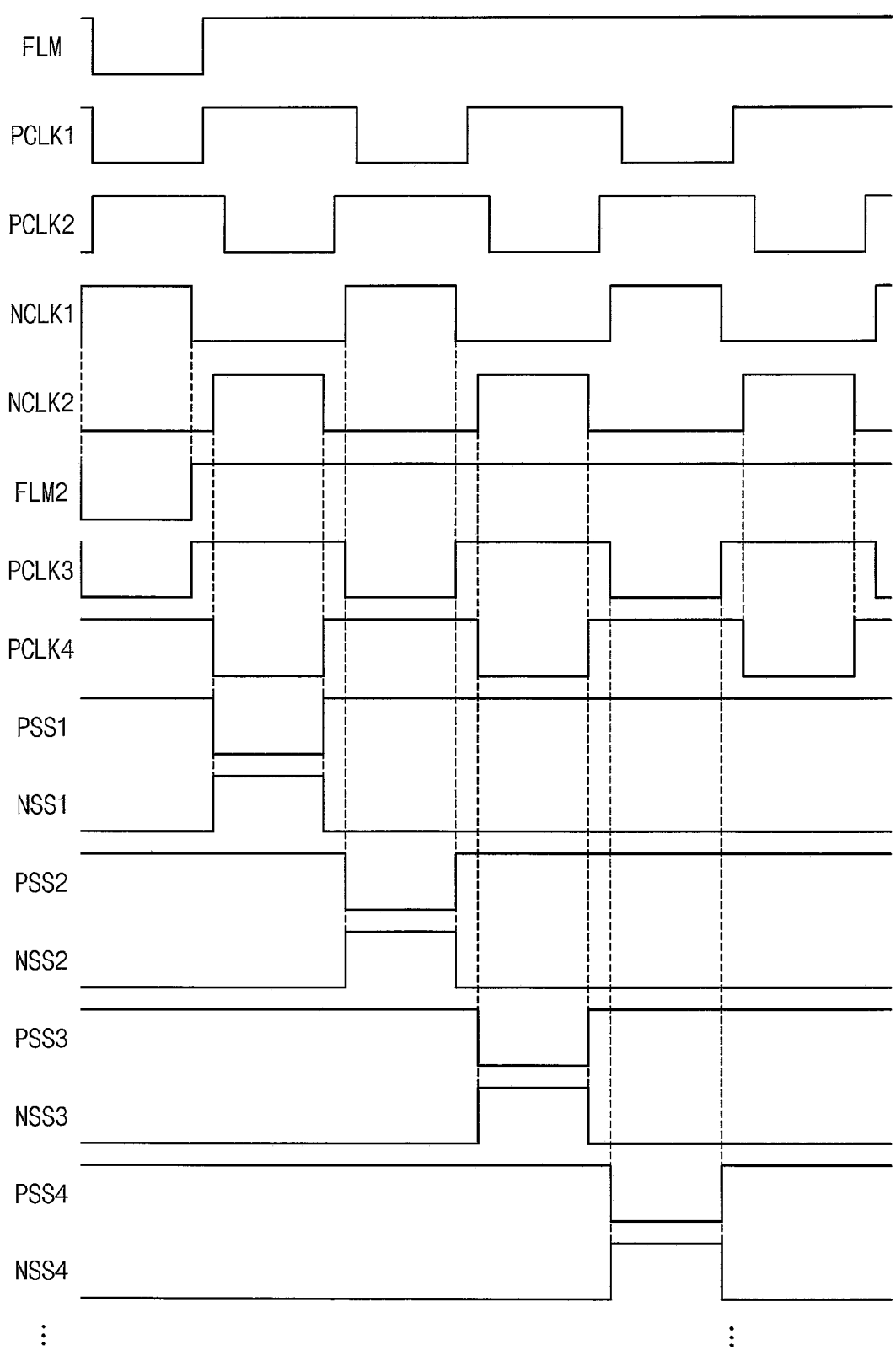
FIG. 18 is a schematic timing diagram for describing an example of an operation of a scan driver according to an embodiment.

FIG. 15 is a schematic block diagram illustrating a display device including a scan driver according to an embodiment, FIG. 16 is a schematic block diagram illustrating a scan driver included in a display device of FIG. 15 according to an embodiment, FIG. 17 is a schematic circuit diagram illustrating a P-type stage included in a scan driver of FIG. 16, and FIG. 18 is a schematic timing diagram for describing an example of an operation of a scan driver according to an embodiment.

Referring to FIG. 15, a display device 400 according to an embodiment may include a display panel 410, a data driver 420, a scan driver 430 and a controller 450. In an embodiment, the display device 400 may further include an emission driver 440 that may provide emission signals SEM to the pixels PX. The display device 400 of FIG. 15 may have a similar configuration and a similar operation to a display device 300 of FIG. 11, except that the scan driver 430 may include not only multiple stages 431, 432, . . . (or multiple NP-integrated stages), but also multiple P-type stages 461, 462, . . . . Unlike multiple stages 331, 332, . . . illustrated in FIG. 11 which provide active-low scan signals PSS1, PSS2, . . . and active-high scan signals NSS1, NSS2, . . . to pixels PX, the multiple stages 431, 432, . . . may sequentially provide only the active-high scan signals NSS1, NSS2, . . . to the pixels PX on a pixel row basis. The multiple P-type stages 461, 462, . . . may sequentially provide the active-low scan signals PSS1, PSS2, . . . to the pixels PX on a pixel row basis.

According to an embodiment, each of the multiple stages 431, 432, . . . may have a similar configuration to a configuration of a stage 100 of FIG. 1, a configuration of a stage 200 of FIG. 10, or the like. As illustrated in FIG. 16, the multiple stages 431, 432, 433, 434, . . . may receive a first scan start signal FLM1, first and second P-type clock signals PCLK1 and PCLK2, and first and second N-type clock signals NCLK1 and NCLK2, and may sequentially provide the active-high scan signals NSS1, NSS2, NSS3, NSS4, . . . to the pixels PX on a pixel row basis. An active-low scan signal generated by each of the multiple stages 431, 432, 433, 434, . . . may not be provided to the pixels PX, and may be used as an input signal for another (e.g., the next) stage, or a carry signal CR1, CR2, CR3, CR4, . . . .

As illustrated in FIG. 16, the multiple P-type stages 461, 462, 463, 464, . . . may receive a second scan start signal FLM2, and third and fourth P-type clock signals PCLK3 and PCLK4. In an embodiment, each of the multiple P-type stages 461, 462, 463, 464, . . . may be implemented as a P-type stage PSTAGE illustrated in FIG. 17. For example, as illustrated in FIG. 17, each P-type stage PSTAGE may include first through seventh transistors M1 through M7, and first and second capacitors PC1 and PC2. In each P-type stage PSTAGE, the first transistor M1 may transfer the second scan start signal FLM2 or a previous active-low scan signal PRE_PSS to a first node N1 in response to the third P-type clock signals PCLK3 (or the fourth P-type clock signals PCLK4), the second transistor M2 may transfer a high gate voltage VGH to a third node N3 in response to a voltage of a second node N2, the third transistor M3 may transfer a voltage of the third node N3 to the first node N1 in response to the fourth P-type clock signals PCLK4 (or the third P-type clock signals PCLK3), the fourth transistor M4 may transfer the third P-type clock signals PCLK3 (or the fourth P-type clock signals PCLK4) to the second node N2 in response to a voltage of the first node N1, the fifth transistor M5 may transfer a low gate voltage VGL to the second node N2 in response to the third P-type clock signals PCLK3 (or the fourth P-type clock signals PCLK4), the sixth transistor M6 may output the high gate voltage VGH as the active-low scan signal PSS to an output node NO in response to the voltage of the second node N2, and the seventh transistor M7 may output the fourth P-type clock signals PCLK4 (or the third P-type clock signals PCLK3) as the active-low scan signal PSS to the output node NO in response to the voltage of the first node N1. Further, the first capacitor PC1 may be electrically connected between a line of the high gate voltage VGH and the second node N2, and the second capacitor PC2 may be electrically connected between the first node N1 and the output node NO. As illustrated in FIG. 17, all of the first through seventh transistors M1 through M7 of each P-type stage PSTAGE may be PMOS transistors. However, a configuration of each of the multiple P-type stages 461, 462, 463, 464, . . . of the scan driver 430 may not be limited to the configuration of FIG. 17.

As illustrated in FIGS. 16 and 18, a first P-type stage 461 may output a first active-low scan signal PSS1 to a first pixel row in synchronization with the fourth P-type clock signal PCLK4, and a first stage 431 may output a first active-high scan signal NSS1 to the first pixel row in synchronization with the second N-type clock signal NCLK2. Further, a second P-type stage 462 may output a second active-low scan signal PSS2 to a second pixel row in synchronization with the third P-type clock signal PCLK3, and a second stage 432 may output a second active-high scan signal NSS2 to the second pixel row in synchronization with the first N-type clock signal NCLK1. Further, a third P-type stage 463 may output a third active-low scan signal PSS3 to a third pixel row in synchronization with the fourth P-type clock signal PCLK4, and a third stage 433 may output a third active-high scan signal NSS3 to the third pixel row in synchronization with the second N-type clock signal NCLK2. Further, a fourth P-type stage 464 may output a fourth active-low scan signal PSS4 to a fourth pixel row in synchronization with the third P-type clock signal PCLK3, and a fourth stage 434 may output a fourth active-high scan signal NSS4 to the fourth pixel row in synchronization with the first N-type clock signal NCLK1. In this manner, the multiple P-type stages 461, 462, 463, 464, . . . may sequentially provide the active-low scan signals PSS1, PSS2, PSS3, PSS4, . . . to the pixels PX on a pixel row basis, and the multiple stages 431, 432, 433, 434, . . . may sequentially provide the active-high scan signals NSS1, NSS2, NSS3, NSS4, . . . to the pixels PX on a pixel row basis. As illustrated in FIG. 18, an active period of the third P-type clock signal PCLK3 may be substantially the same as (or substantially fully overlap) an active period of the first N-type clock signal NCLK1, and an active period of the fourth P-type clock signal PCLK4 may be substantially the same as (or substantially fully overlap) an active period of the second N-type clock signal NCLK2. An active period of each active-low scan signal (e.g., PSS1) may be substantially the same as (or substantially fully overlap) an active period of a corresponding active-high scan signal (e.g., NSS1).

Figure 19:
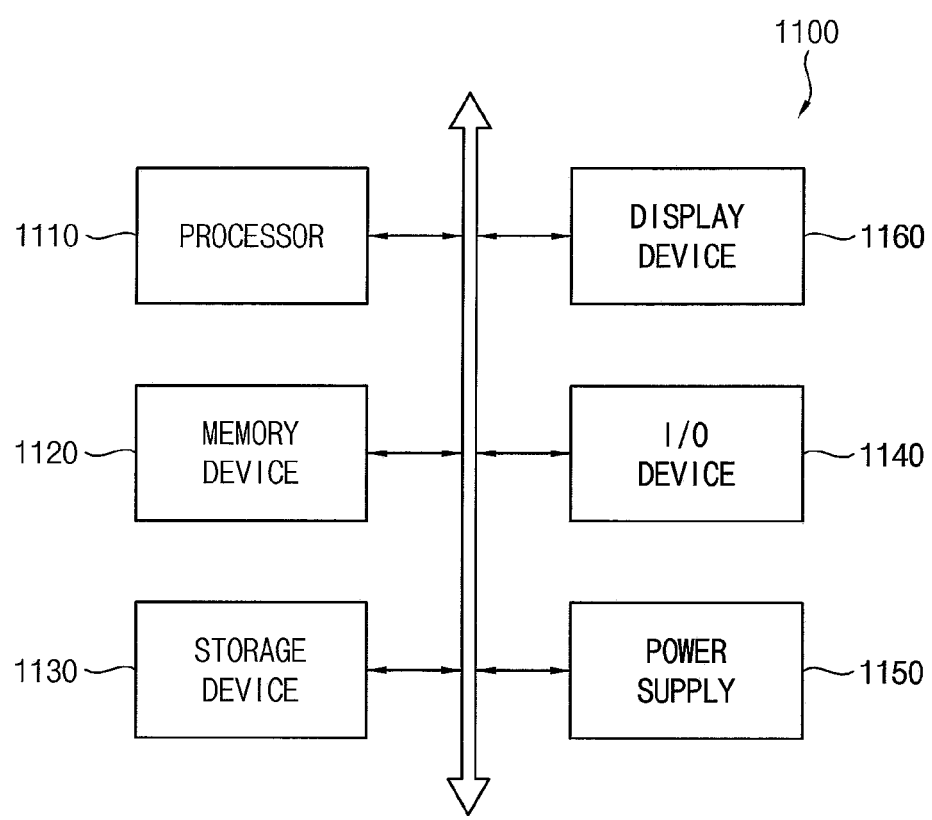
FIG. 19 is a schematic block diagram illustrating an electronic device including a display device according to an embodiment.

FIG. 19 is a schematic block diagram illustrating an electronic device including a display device according to an embodiment.

Referring to FIG. 19, an electronic device 1100 may include a processor 1110, a memory device 1120, a storage device 1130, an input/output (I/O) device 1140, a power supply 1150, and a display device 1160. The electronic device 1100 may further include ports for communicating with a video card, a sound card, a memory card, a universal serial bus (USB) device, other electric devices, or the like.

The processor 1110 may perform various computing functions or tasks. The processor 1110 may be an application processor (AP), a micro processor, a central processing unit (CPU), or the like. The processor 1110 may be electrically connected to other components via an address bus, a control bus, a data bus, or the like. Further, in an embodiment, the processor 1110 may be further electrically connected to an extended bus such as a peripheral component interconnection (PCI) bus.

The memory device 1120 may store data for operations of the electronic device 1100. For example, the memory device 1120 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, or the like, and/or at least one volatile memory device such as a dynamic random access memory (DRAM) device, a static random access memory (SRAM) device, a mobile dynamic random access memory (mobile DRAM) device, or the like.

The storage device 1130 may be a solid state drive (SSD) device, a hard disk drive (HDD) device, a CD-ROM device, or the like. The I/O device 1140 may be an input device such as a keyboard, a keypad, a mouse, a touch screen, or the like, and an output device such as a printer, a speaker, or the like. The power supply 1150 may supply power for operations of the electronic device 1100. The display device 1160 may be electrically connected to other components through the buses or other communication links.

In the display device 1160, each stage of a scan driver may include a first output buffer that may output an active-low scan signal and a second output buffer that may output an active-high scan signal. Accordingly, a size and power consumption of the scan driver of the display device 1160 according to an embodiment may be reduced compared with a conventional scan driver including separate stages that respectively output the active-low scan signal and the active-high scan signal.

The concepts of this disclosure may be applied to any display device 1160, and any electronic device 1100 including the display device 1160. For example, the concepts may be applied to a mobile phone, a smart phone, a wearable electronic device, a tablet computer, a television (TV), a digital TV, a 3D TV, a personal computer (PC), a home appliance, a laptop computer, a personal digital assistant (PDA), a portable multimedia player (PMP), a digital camera, a music player, a portable game console, a navigation device, or the like.

The foregoing is illustrative of example embodiments and is not to be construed as limiting thereof. Although a few embodiments have been described, those skilled in the art will readily appreciate that many modifications are possible in the embodiments without materially departing from the novel teachings and advantages of the disclosure. Accordingly, all such modifications are intended to be included within the scope of the disclosure as defined in the claims and any equivalents.

What is claimed is:

1. A scan driver comprising:
a plurality of stages receiving a first clock signal, a second clock signal and a third clock signal, each of the plurality of stages comprising:
a logic circuit that changes a voltage of a first node to a first low level based on an input signal and the first clock signal, and changes the voltage of the first node to a second low level based on the second clock signal, a voltage level of the second low level being lower than a voltage level of the first low level;
a first output buffer that outputs a first output signal in synchronization with the second clock signal based on the voltage of the first node; and
a second output buffer that outputs a second output signal in synchronization with the third clock signal based on the voltage of the first node,
wherein a low period of the third clock signal at least partially overlaps a low period of the second clock signal.

2. The scan driver of claim 1, wherein, while the first output signal is output, the low period of the third clock signal partially overlaps the low period of the second clock signal.

3. The scan driver of claim 1, wherein a high period of the third clock signal from a rising edge of the third clock signal to a falling edge of the third clock signal partially overlaps the low period of the second clock signal from a falling edge of the second clock signal to a rising edge of the second clock signal.

4. The scan driver of claim 1, wherein
a rising edge of the third clock signal lags a falling edge of the first clock signal, and
a falling edge of the third clock signal lags a falling edge of the second clock signal, and leads a rising edge of the second clock signal.

5. The scan driver of claim 1, wherein the logic circuit includes:
an input part that transfers the input signal to a third node in response to the first clock signal;
a stress relaxing part disposed between the first node and the third node, the stress relaxing part transferring the input signal from the third node to the first node such that the voltage of the first node is changed to the first low level;
a bootstrap part that changes the voltage of the first node to the second low level by bootstrapping the first node in response to the second clock signal;
a holding part that holds a second node and a fourth node as a high level while the first output signal and the second output signal are output; and
a stabilizer part that
applies a high gate voltage to the third node in response to a voltage of the fourth node, and
changes a voltage of the second node to the second low level after the first output signal and the second output signal are output.

6. The scan driver of claim 5, wherein the input part includes:
a first transistor including a gate receiving the first clock signal, a first terminal receiving the input signal, and a second terminal electrically connected to the third node.

7. The scan driver of claim 5, wherein the bootstrap part includes:
a first capacitor including a first electrode electrically connected to a first output node at which the first output signal is output, and a second electrode electrically connected to the first node.

8. The scan driver of claim 5, wherein the stabilizer part includes:
a second transistor including a gate electrically connected to the fourth node, a first terminal receiving the high gate voltage, and a second terminal electrically connected to the third node;
a second capacitor including a first electrode electrically connected to the fourth node, and a second electrode electrically connected to the second node;
a third transistor including a gate electrically connected to the second node, a first terminal electrically connected to the fourth node, and a second terminal receiving the second clock signal; and
a fifth transistor including a gate receiving the first clock signal, a first terminal electrically connected to the second node, and a second terminal receiving a low gate voltage.

9. The scan driver of claim 5, wherein each of the plurality of stages receives a fourth clock signal having a phase different from a phase of the third clock signal, and
the stabilizer part includes:
a second transistor including a gate electrically connected to the fourth node, a first terminal receiving the high gate voltage, and a second terminal electrically connected to the third node;
a second capacitor including a first electrode electrically connected to the fourth node, and a second electrode electrically connected to the second node;
a third transistor including a gate electrically connected to the second node, a first terminal electrically connected to the fourth node, and a second terminal receiving the fourth clock signal; and
a fifth transistor including a gate receiving the first clock signal, a first terminal electrically connected to the second node, and a second terminal receiving a low gate voltage.

10. The scan driver of claim 5, wherein the holding part includes:
a fourth transistor including a gate electrically connected to the third node, a first terminal electrically connected to the second node, and a second terminal receiving the first clock signal; and
a sixth transistor including a gate electrically connected to the third node, a first terminal receiving the high gate voltage, and a second terminal electrically connected to the fourth node.

11. The scan driver of claim 5, wherein the stress relaxing part includes:
a seventh transistor including a gate receiving a low gate voltage, a first terminal electrically connected to the third node, and a second terminal electrically connected to the first node.

12. The scan driver of claim 1, wherein the first output buffer includes:
an eighth transistor including a gate electrically connected to the first node, a first terminal electrically connected to a first output node at which the first output signal is output, and a second terminal receiving the second clock signal; and
a ninth transistor including a gate electrically connected to a second node, a first terminal receiving a high gate voltage, and a second terminal electrically connected to the first output node.

13. The scan driver of claim 1, wherein the second output buffer includes:
a tenth transistor including a gate electrically connected to the first node, a first terminal electrically connected to a second output node at which the second output signal is output, and a second terminal receiving the third clock signal; and
an eleventh transistor including a gate electrically connected to a second node, a first terminal receiving a low gate voltage, and a second terminal electrically connected to the second output node.

14. A scan driver including a plurality of stages, each of the plurality of stages comprising:
a first transistor including a gate receiving a first clock signal, a first terminal receiving an input signal, and a second terminal electrically connected to a third node;
a seventh transistor including a gate receiving a low gate voltage, a first terminal electrically connected to the third node, and a second terminal electrically connected to a first node;
a first capacitor including a first electrode electrically connected to a first output node, and a second electrode electrically connected to the first node;
an eighth transistor including a gate electrically connected to the first node, a first terminal electrically connected to the first output node, and a second terminal receiving a second clock signal;
a ninth transistor including a gate electrically connected to a second node, a first terminal receiving a high gate voltage, and a second terminal electrically connected to the first output node;
a tenth transistor including a gate electrically connected to the first node, a first terminal electrically connected to a second output node, and a second terminal receiving a third clock signal; and
an eleventh transistor including a gate electrically connected to the second node, a first terminal receiving the low gate voltage, and a second terminal electrically connected to the second output node.

15. The scan driver of claim 14, wherein the first, second and third clock signals have different phases.

16. The scan driver of claim 14, wherein a low period of the third clock signal partially overlaps a low period of the second clock signal.

17. The scan driver of claim 16, wherein each of the plurality of stages further comprises:
a second transistor including a gate electrically connected to a fourth node, a first terminal receiving the high gate voltage, and a second terminal electrically connected to the third node;
a third transistor including a gate electrically connected to the second node, a first terminal electrically connected to the fourth node, and a second terminal;
a fourth transistor including a gate electrically connected to the third node, a first terminal electrically connected to the second node, and a second terminal receiving the first clock signal;
a fifth transistor including a gate receiving the first clock signal, a first terminal electrically connected to the second node, and a second terminal receiving the low gate voltage;
a sixth transistor including a gate electrically connected to the third node, a first terminal receiving the high gate voltage, and a second terminal electrically connected to the fourth node; and
a second capacitor including a first electrode electrically connected to the fourth node, and a second electrode electrically connected to the second node.

18. The scan driver of claim 17, wherein the second terminal of the third transistor receives the second clock signal, or receives a fourth clock signal having a phase different from that of the third clock signal.

19. The scan driver of claim 14, wherein
a rising edge of the third clock signal lags a falling edge of the first clock signal, and
a falling edge of the third clock signal lags a falling edge of the second clock signal, and leads a rising edge of the second clock signal.

20. A display device comprising:
a display panel including a plurality of pixels;
a data driver that provides data signals to the plurality of pixels;
a scan driver that provides first output signals and second output signals to the plurality of pixels; and
a controller that controls the data driver and the scan driver,
wherein the scan driver includes a plurality of stages receiving a first clock signal, a second clock signal and a third clock signal, each of the plurality of stages comprising:
a logic circuit that changes a voltage of a first node to a first low level based on an input signal and the first clock signal, and changes the voltage of the first node to a second low level based on the second clock signal, a voltage level of the second low level being lower than a voltage level of the first low level;
a first output buffer that outputs a corresponding one of the first output signals in synchronization with the second clock signal based on the voltage of the first node; and
a second output buffer that outputs a corresponding one of the second output signals in synchronization with the third clock signal based on the voltage of the first node,
wherein a low period of the third clock signal at least partially overlaps a low period of the second clock signal.

* * * * *